(12) United States Patent
Sato et al.

(10) Patent No.: US 7,915,179 B2
(45) Date of Patent: Mar. 29, 2011

(54) INSULATING FILM FORMING METHOD AND SUBSTRATE PROCESSING METHOD

(75) Inventors: Yoshihiro Sato, Amagasaki (JP); Tomoe Nakayama, Toyonaka (JP); Hiroshi Kobayashi, Nirasaki (JP); Yoshinori Osaki, Nirasaki (JP); Tetsuro Takahashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 871 days.

(21) Appl. No.: 11/718,582

(22) PCT Filed: Nov. 2, 2005

(86) PCT No.: PCT/JP2005/020190
§ 371 (c)(1),
(2), (4) Date: May 4, 2007

(87) PCT Pub. No.: WO2006/049199
PCT Pub. Date: May 11, 2006

(65) Prior Publication Data
US 2008/0000551 A1  Jan. 3, 2008

(30) Foreign Application Priority Data

Nov. 4, 2004 (JP) ................... 2004-320743
Aug. 31, 2005 (JP) ................... 2005-251820

(51) Int. Cl.
*H01L 21/469* (2006.01)
*H01L 21/31* (2006.01)

(52) U.S. Cl. ......... 438/775; 438/770; 438/787; 438/791

(58) Field of Classification Search ................... None
See application file for complete search history.

(56) References Cited

U.S. PATENT DOCUMENTS

| 6,649,538 | B1 | 11/2003 | Cheng et al. |
| 6,669,825 | B2* | 12/2003 | Ohmi et al. ............. 204/192.12 |
| 7,166,185 | B2* | 1/2007 | Murakawa et al. ....... 156/345.44 |
| 2002/0197883 | A1* | 12/2002 | Niimi et al. ................... 438/775 |

FOREIGN PATENT DOCUMENTS

| JP | 11 204517 | 7/1999 |
| JP | 2003 297822 | 10/2003 |
| JP | 2004 119899 | 4/2004 |
| KR | 2000-0013294 | 3/2000 |
| KR | 2004-0086384 | 10/2004 |
| WO | WO 03/107399 A2 | 12/2003 |

* cited by examiner

*Primary Examiner* — Mary Wilczewski
*Assistant Examiner* — Khanh B Duong
(74) *Attorney, Agent, or Firm* — Oblon, Spivak, McClelland, Maier & Neustadt, L.L.P.

(57) ABSTRACT

In a method for forming an insulating film by performing plasma nitriding process to an oxide film on a substrate and then by annealing the substrate in a process chamber (51), the substrate is annealed under a low pressure of 667 Pa or lower. The annealing is performed for 5 or 45 seconds. The plasma nitriding process is performed by microwave plasma by using a planar antenna whereupon a multitude of slot holes are formed.

22 Claims, 15 Drawing Sheets

INSULATING FILM FORMING METHOD AND SUBSTRATE PROCESSING METHOD

FIELD OF THE INVENTION

The present invention relates to an insulating film forming method and a substrate processing method for performing an annealing treatment or other treatments to an object substrate such as a semiconductor wafer or the like.

BACKGROUND OF THE INVENTION

In a gate insulating film of recently semiconductor devices, e.g., a metal-oxide-semiconductor field-effect transistor (MOSFET), an oxynitride film is employed to prevent a so-called pass-through phenomenon. It is often the case that formation of the oxynitride film is performed by subjecting an oxide film to a plasma nitriding treatment.

Meanwhile, it is a recent trend that the MOSFET itself becomes extremely miniaturized and, in concert with such miniaturization, the gate insulating film is controlled to be in an ultra-thin film region (of about 1.0 nm). In such a thin insulating film, however, there is a fear of degradation of a transistor-on current and reduction of an operating speed.

In view of this, JP2004-48001A proposes a method of performing an annealing treatment to an insulating film subsequent to a plasma nitriding treatment thereof in an effort to recover damage caused at the time of plasma nitriding treatment.

However, the conventional annealing treatment is what is called a "heavy annealing treatment", for the reason of which oxygen is diffused to an interface by the annealing treatment, thereby increasing a thickness of the insulating film and decreasing an operating speed. In particular, there is a concern of degradation of an NBTI (Negative Bias Temperature Instability) characteristic remarkably appearing in a PMOSFET.

As one example of the annealing treatment, there is known an RTP (Rapid Thermal Processing). Although annealing is performed for the purpose of re-sequence impurities or recovering crystal damage after ions are injected into, e.g., a semiconductor wafer (hereinafter often referred to as "wafer"), there is a tendency that, if a thermal budget (thermal treatment quantity) grows high in the annealing process, diffusion of a dopant occurs in a source-drain region of, e.g., a transistor, to thereby create a deep junction. Inasmuch as a shallow junction is indispensable under a miniaturized design rule, use has been made of the RTP capable of reducing a total thermal budget by rapidly raising and lowering a temperature within a short period of time (so-called spike annealing).

It is important in the RTP that an in-plane temperature of the wafer is kept uniform in order to equalize the characteristics of electronic devices manufactured from one and the same wafer. However, if the temperature is straightly and rapidly raised up to a predetermined annealing temperature in the RTP, overshoot occurs in the wafer temperature, thus reducing temperature control accuracy. Furthermore, there is a problem in that non-uniformity in a wafer in-plane temperature becomes great due to the rapid temperature elevation and a crystal defect called "slip" arises as the wafer is warped.

Taking this into account, JP2000-331949A suggests a method for assuring an in-plane temperature uniformity in an RIP, the method being adapted to provide a heat-up process of multiple steps and perform an annealing treatment, while gradually ducing a temperature elevation speed in the respective heat-up steps, until the temperature reaches a predetermined annealing te perature. However, JP2000-331949A provides no concrete and positive disclosure on a temperature region and time in the respective heat-up steps, mean that the method fails to disclose a relationship between a slip and a time/temperature or throughput. Furthermore, although the prior art method can improve overshoot of the wafer temperature and non-uniformity of the in-plane temperature by gradually reduces a temperature elevation speed in the respective heat-up steps, it suffers from a problem of throughput reduction. Considering that a greatest advantage of the RTP resides in its ability to increase a throughput and suppress a thermal budget, the method taught in JP2000-331949A is not satisfactory.

DISCLOSURE OF THE INVENTION

In view of the circumstances noted above, it is a first object of the present invention to provide an insulating film forming method that can suppress a thickness increase at the time of forming an insulating film, avoid degradation of an ON-current characteristic between a source and a drain and inhibit degradation of an NBTI characteristic.

A second object of the present invention is to provide a substrate processing method that, in case of processing a substrate at a temperature of 800° C. or above, can reliably prevent overshoot of a substrate temperature and occurrence of a warp or a slip of the substrate in a temperature elevation process and is capable of processing the substrate at a high throughput.

To achieve the above objects, in accordance with a first aspect of the present invention, there is provided an insulating film forming method, including: a nitriding treatment step of subjecting an oxide film on an object substrate to a plasma nitriding treatment; and an annealing treatment step of annealing the nitrided object substrate at a pressure of 667 Pa or less.

Likewise, by performing a so called light annealing treatment, which is an annealing treatment to be performed after the plasma nitriding treatment, at a pressure of 667 Pa or less in a depressurized atmosphere, an increase in film thickness can be suppressed. Further, a transistor-ON current and an operating speed thereof can be enhanced.

The annealing treatment under the pressure may be 667 Pa (5 Torr) or below. Further, an oxygen partial pressure may be performed at a pressure of 13.33 to 133.3 Pa (0.1 to 1.0 Torr) and more preferably of 40 to 94 Pa (0.3 to 0.7 Torr).

Annealing time may be of 5 to 40 seconds.

Also, as for the annealing treatment itself, instead of having a sudden spike shape annealing, a heating process of the below is preferred. That is, the annealing treatment may be divided into a first annealing treatment step and a second annealing treatment step which is performed subsequent to the first annealing treatment step, and the first annealing treatment step is performed at an annealing temperature of 600° C. to 700° C. for an annealing time of 1 to 40 seconds and the second annealing treatment step is performed at an annealing temperature of 950° C. to 1150° C. for an annealing time of 5 to 60 seconds.

Further, the annealing time of the second annealing treatment step is 10 to 40 seconds.

Further, the insulating film forming method may include a first temperature elevation step of heating up the object substrate at a first heat-up rate to the annealing temperature of 600° C. to 700° C. of the first annealing treatment step; a second temperature elevation step of heating up the object substrate at a second heat-up rate from the annealing temperature of 600° C. to 700° C. of the first annealing treatment step to an intermediate temperature lower than the annealing temperature of 950° C. to 1150° C. of the second annealing treatment step; and a third temperature elevation step of heating up the object substrate at a third heat-up rate to the annealing temperature of 950° C. to 1150° C. of the second annealing treatment step, wherein the intermediate temperature $K_M$ is defined to satisfy the following equation: $3 \leq (K_2 - K_M)/Y \leq 7$, where $K_2$ is the annealing temperature of the second annealing treatment step and Y denotes a temperature elevation breadth per second in case of the third heat-up rate, and wherein the second heat-up rate is greater than the third heat-up rate.

Further, the third heat-up rate may be equal to or greater than the first heat-up rate, and the second heat-up rate may be 40° C./sec to 60° C./sec. In addition, the third heat-up rate may be 15° C./sec to 30° C./sec, and the first heat-up rate may be 5° C./sec to 15° C./sec.

Further, the oxide film may be subjected to the plasma nitriding treatment by a microwave plasma generated by using a planar antenna having a multiple number of slot holes. According to the above, damages occurring during the plasma nitriding treatment can be further suppressed, and the annealing treatment being performed thereafter can be performed as a lighter annealing treatment.

Further, the oxide film may be formed by thermal oxidation or plasma oxidation. Further, the object substrate subjected to the plasma nitriding treatment may be loaded into and annealed by an annealing apparatus that performs an annealing treatment, the object substrate being loaded into the annealing apparatus in a depressurized atmosphere without being exposed to the ambient air.

Moreover, in accordance with a second aspect of the present invention, there is provided a computer-readable storage medium in which a software operable in a computer is stored, comprising a software for causing an annealing apparatus to perform an annealing treatment of an insulating film forming method, wherein the insulating film forming method includes: a nitriding treatment step of subjecting an oxide film on an object substrate to a plasma nitriding treatment; and an annealing treatment step of annealing the nitrided object substrate at a pressure of 667 Pa or less.

Furthermore, in accordance with a third aspect of the present invention, there is provided a substrate processing method, including: a first temperature elevation step of heating up, in a processing chamber of a substrate processing apparatus, an object substrate at a first heat-up rate to a first temperature at which emissivity of the object substrate is greatest; a second temperature elevation step of heating up the object substrate at a second heat-up rate from the first temperature to a second temperature which is lower than a heat treatment temperature; and a third temperature elevation step of heating up the object substrate at a third heat-up rate from the second temperature to the heat treatment temperature, wherein the heat treatment temperature is equal to or greater than 800° C. and the second temperature X is defined to satisfy the following equation: $3 \leq (T-X)/Y \leq 7$, where T denotes the heat treatment temperature and Y is a temperature elevation breadth per second in case of the third heat-up rate, and wherein the second heat-up rate is greater than the third heat-up rate.

In accordance with the third aspect of the present invention, the third heat-up rate is equal to or greater than the first heat-up rate. Further, the second heat-up rate may be 40° C./sec to 60° C./sec, and the third heat-up rate may be 15° C./sec to 30° C./sec. In addition, the first heat-up rate may be 5° C./sec to 15° C./sec. Further, the heat treatment temperature may be 800° C. to 1100° C., the object substrate may be a silicon substrate and the first temperature is 600° C. to 700° C. Moreover, the substrate processing apparatus may be a RTP apparatus, and the object substrate may be processed at a processing pressure of 106.66 Pa to 101325 Pa.

In accordance with a fourth aspect of the present invention, there is provided a software operable in a computer for controlling, when executed, a substrate processing apparatus to perform a substrate processing method, wherein the substrate processing method includes: a first temperature elevation step of heating up, in a processing chamber of the substrate processing apparatus, an object substrate at a first heat-up rate to a first temperature at which emissivity of the object substrate is greatest; a second temperature elevation step of heating up the object substrate at a second heat-up rate from the first temperature to a second temperature which is lower than a heat treatment temperature; and a third temperature elevation step of heating up the object substrate at a third heat-up rate from the second temperature to the heat treatment temperature, wherein the heat treatment temperature is equal to or greater than 800° C. and the second temperature X is defined to satisfy the following equation: $3 \leq (T-X)/Y \leq 7$, where T denotes the heat treatment temperature and Y is a temperature elevation breadth per second in case of the third heat-up rate, and wherein the second heat-up rate is greater than the third heat-up rate.

In accordance with a fifth aspect of the present invention, there is provided a computer-readable storage medium in which a software operable in a computer is stored, wherein the software controls, when executed, a substrate processing apparatus to perform a substrate processing method, wherein the substrate processing method includes: a first temperature elevation step of heating up, in a processing chamber of the substrate processing apparatus, an object substrate at a first heat-up rate to a first temperature at which emissivity of the object substrate becomes greatest; a second temperature elevation step of heating up the object substrate at a second heat-up rate from the first temperature to a second temperature lower than a heat treatment temperature; and a third temperature elevation step of heating up the object substrate at a third heat-up rate from the second temperature to the heat treatment temperature, wherein the heat treatment temperature is equal to or greater than 800° C. and the second temperature X is defined to satisfy the following equation: $3 \leq (T-X)/Y \leq 7$, where T denotes the heat treatment temperature and Y is a temperature elevation breadth per second in the third heat-up rate, and wherein the second heat-up rate is greater than the third heat-up rate.

In accordance with a sixth aspect of the present invention, there is provided a substrate processing apparatus, including: a processing vessel for accommodating an object substrate; a heating unit for heating up the object substrate in the processing vessel; and a control unit for controlling execution of a substrate processing method, wherein the substrate processing method includes: a first temperature elevation step of heating up, in the processing vessel, the object substrate at a first heat-up rate to a first temperature at which emissivity of the object substrate becomes greatest; a second temperature elevation step of heating up the object substrate at a second heat-up rate from the first temperature to a second temperature lower than a heat treatment temperature; and a third temperature elevation step of heating up the object substrate at a third heat-up rate from the second temperature to the heat treatment temperature, wherein the heat treatment temperature is equal to or greater than 800° C. and the second temperature X is defined to satisfy the following equation: $3 \leq (T-X)/Y \leq 7$, where T denotes the heat treatment temperature and Y is a temperature elevation breadth per second in case of the third heat-up rate, and wherein the second heat-up rate is greater than the third heat-up rate.

In accordance with an insulating film forming method of the present invention, it is possible to suppress a thickness increase at the time of forming an insulating film, avoid degradation of an ON-current characteristic between a source and a drain and inhibit degradation of an NBTI characteristic.

Furthermore, in accordance with a substrate processing method of the present invention comprising a first temperature elevation step of heating up an object substrate to a first temperature at which the object substrate exhibits a maximum emissivity, a second temperature elevation step of heating up the object substrate from the first temperature to a second temperature lower than a heat treatment temperature, and a third temperature elevation step of heating up the object substrate from the second temperature to the heat treatment temperature, it is possible to increase a processing throughput, suppress overshoot and non-uniformity of a substrate in-plane temperature caused by rapid temperature elevation and reduce defects such as slip or the like, by making a heat-up rate in the second temperature elevation step greater than a heat-up rate in the third temperature elevation step. Moreover, a high throughput can be realized by inclusion of the second temperature elevation step having an increased heat-up rate. This makes it possible to reduce a total thermal budget and also cope with a design rule whose miniaturization is in progress.

DETAILED DESCRIPTION OF THE EMBODIMENTS

Figure 1:
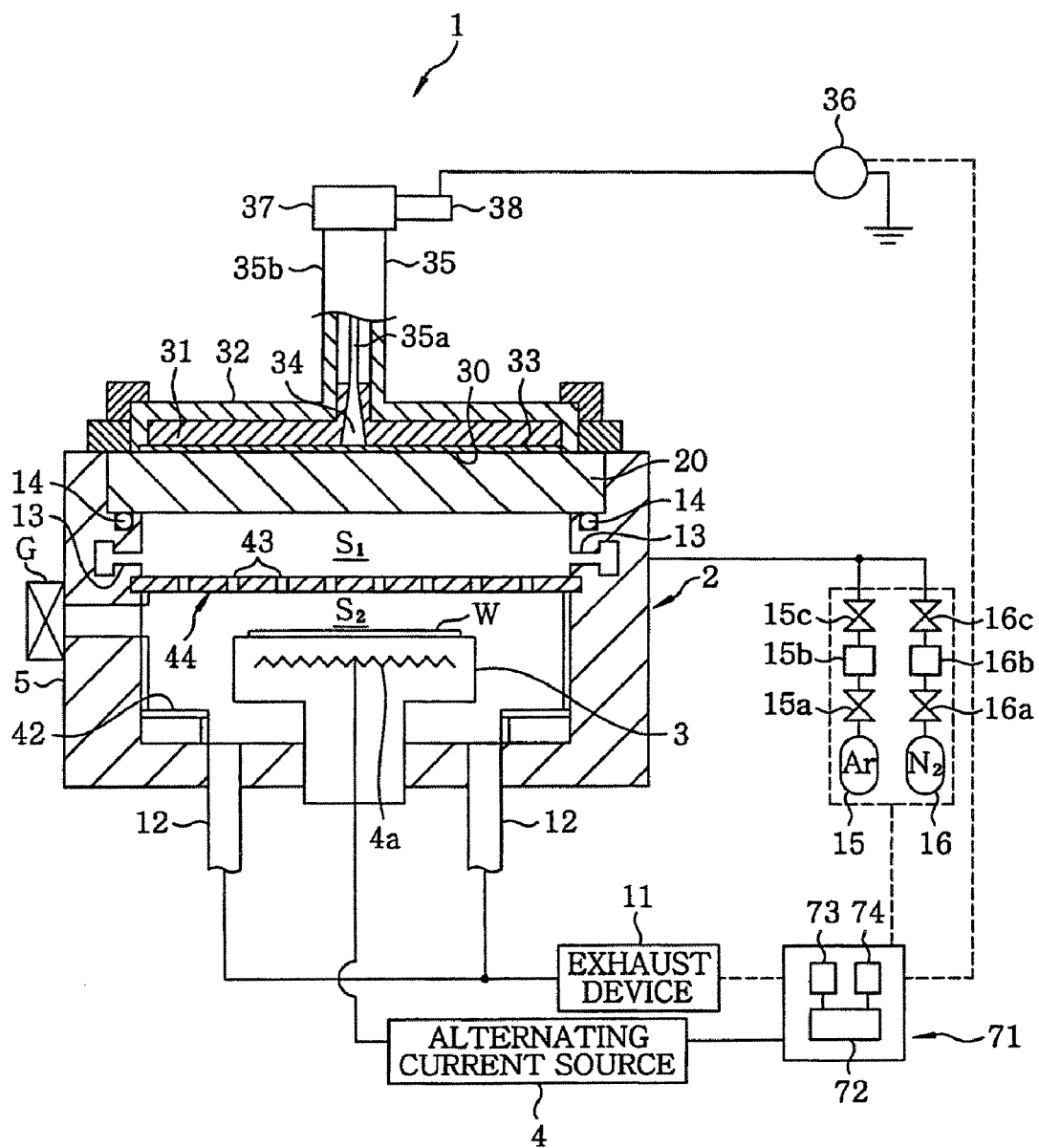
FIG. 1 is an explanatory vertical section view showing a plasma processing apparatus for performing a method in accordance with one embodiment.

Hereinafter, embodiments of the present invention will be described. FIG. 1 shows a vertical section of a plasma processing apparatus 1 for performing a gate insulating film forming method in accordance with the present embodiment. The plasma processing apparatus 1 includes a upper portion-opened and bottom-closed cylindrical processing vessel 2 made of, e.g., aluminum, the processing vessel 2 being kept grounded. On a bottom portion of the processing vessel 2, there is provided a susceptor 3 that serves as a table for holding a substrate, e.g., a wafer W. The susceptor 3 is made of, e.g., aluminum, and is provided with a heater 4a therein. The heater 4a may be composed of, e.g., a resistor, and is adapted to generate heat as electric power is supplied from an alternating current source 4 provided outside the processing vessel 2. The heater 4a is capable of heating the wafer on the susceptor 3 to a predetermined temperature.

On the bottom portion of the processing vessel 2, there is provided an evacuation pipe 12 through which the interior of the processing vessel 2 is evacuated by means of an exhaust device 11 such as a vacuum pump or the like. Furthermore, on a side wall of the processing vessel 2, there is provided a gas introduction section 13 for introducing a processing gas supplied from a processing gas source supply into the processing vessel 2. In the present embodiment, an argon gas source supply 15 and a nitrogen gas source supply 16 are provided as the processing gas source supply, both of which are connected to the gas introduction section 13 via valves 15a and 16a, mass flow controllers 15b and 16b and valves 15c and 16c.

In a upper portion opening of the processing vessel 2, there is provided a transmission window 20 through a sealing material 14, such as an O-ring or the like, for assuring air-tightness, the transmission window 20 being made of a dielectric material, e.g., quartz glass. Other dielectric materials, e.g., AlN, $Al_2O_3$, sapphire, SiN and ceramics, may be used in place of quartz glass. Processing spaces $S_1$ and $S_2$ are defined in the processing vessel 2 by the transmission window 20. The transmission window 20 has a circular shape when viewed from the upper portion thereof but may also be, e.g., a rectangular shape.

An antenna member, e.g., a disc-shaped slot antenna 30 is provided above the transmission window 20. On a upper surface of the slot antenna 30, there is provided a slow-wave plate 31 and an antenna cover 32 for covering the retardation plate 31, the antenna cover 32 being made of metal such as aluminum or the like. The antenna cover 32 is provided with a cooling section for cooling the slot antenna 30 or the like. The slot antenna 30 is formed of an electrically conductive material, e.g., a thin copper disc, and has a surface plated with, e.g., gold or silver. A multiple number of slits 33 serving as slot holes are formed in the slot antenna 30, e.g., in a spiral pattern or a coaxial circle pattern, thus providing a so-called radial line slot antenna. The slot holes are not limited to the slit shape but may have various kinds of other shapes.

A rod-shaped internal conductor 35a made of an electrically conductive material, e.g., metal, is arranged at and connected to the center of the slot antenna 30. The internal conductor 35a has an end portion 34 formed in a flare shape so that it can propagate microwaves efficiently and uniformly. The internal conductor 35a and an external conductor 35b formed outside the internal conductor 35a constitute a coaxial waveguide tube 35. The internal conductor 35a is electrically connected to the slot antenna 30. Microwaves of, e.g., 2.45 GHz, generated in a microwave supply device 36 are propagated to the slot antenna 30 via a rectangular waveguide tube 38, a load matching box 37, the coaxial waveguide tube 35 and the slow-wave plate 31. Then, the microwaves are introduced from the slot antenna 30 into the processing vessel 2 through the transmission window 20. Energy of the microwaves creates an electromagnetic field on a lower surface of the transmission window 20 in the processing vessel 2. Thus, the processing gas supplied into the processing vessel 2 by the gas introduction section 13 is uniformly turned to plasma, whereby the wafer W held on the susceptor 3 is subjected to a uniform plasma treatment, e.g., a plasma nitriding treatment.

A quartz liner 42 is provided on inner wall surface of the processing vessel 2 below the gas introduction section 13. This ensures that the inner wall surface of the processing vessel 2 is prevented from metal contamination which would otherwise occur by sputtering when the plasma is generated in the processing vessel 2.

A shower plate 44 having a multiple number of through-holes 43 is arranged between the transmission window 20 and the susceptor 3. A plasma processing space is divided into an upper space $S_1$ and a lower space $S_2$ by the shower plate 44. The shower plate 44 is disposed below the gas introduction section 13 and supported by the quartz liner 42. The number of the through-holes 43 is 949 in case of having an apparatus that processes a wafer W of 300 mm in diameter and 626 in case of having an apparatus that processes a wafer W of 200 mm in diameter, for example. By providing the shower plate 44, a silicon oxide film ($SiO_2$) can be subjected to nitriding treatment and turned to a silicon nitride film (SiON), while reducing plasma ion energy and alleviating damage of a base film formed on the wafer W.

A gate valve G through which the wafer W is transferred into or taken out from the processing vessel 2 is provided on a side wall 5 of the processing vessel 2.

The plasma processing apparatus 1 of the configuration set forth above is controlled by means of a controller 71. The controller 71 includes a central processing unit 72, a support circuit 73 and a storage medium 74 containing a relevant control software. The controller 71 controls, e.g., supply of a gas from the gas introduction section 13, stoppage of the gas supply, adjustment of a gas flow rate, temperature control of the heater 4a, evacuation of the exhaust device 11, and an operation of the microwave supply device 36. The controller 71 performs control tasks required in the respective plasma treatment processes in the plasma processing apparatus 1.

The central processing unit 72 of the controller 71 may be a processor for use in a general purpose computer. The storage medium 74 may be various types of storage media including, e.g., a RAM, a ROM, a flexible disk and a hard disk. Furthermore, the support circuit 73 is connected to the central processing unit 72 in order to support the same in various kinds of support methods.

The plasma processing apparatus 1 having the configuration described hereinabove performs a plasma nitriding treatment to a wafer W on which a silicon oxide film is formed by a separate oxidation treatment apparatus. The present invention is applicable to various kinds of oxide films including a so-called thermal oxide film formed, e.g., through a heat treatment at 900° C. to 1100° C. in a steam atmosphere and a plasma oxide film oxidized, e.g., in a plasma processing apparatus. In this case, an oxide film obtained by, e.g., a microwave-used plasma oxidation treatment, can be formed with reduced damage by turning an oxygen gas and a rare gas, such as argon, krypton, helium or the like, to plasma by use of the same apparatus as the plasma processing apparatus 1 noted above and performing an oxidation treatment using oxygen radicals. Therefore, it is possible to form an extremely preferred insulating film by combining a microwave-used plasma nitriding treatment and a two-step annealing treatment of the embodiment which will be described later.

In the process of plasma nitriding treatment, the wafer W is placed on the susceptor 3 in the processing vessel 2 and the processing space S is set at a predetermined pressure by performing evacuation through the evacuation pipe 12 while supplying a specified processing gas, e.g., an argon-nitrogen mixture gas, into the processing vessel 2 through the gas introduction section 13. Then, the wafer W is heated to a predetermined temperature by means of the heater 4a. Microwaves are generated by the microwave supply device 36 and the processing gas in the processing vessel 2 is turned to plasma, whereby a silicon oxide film on the wafer W is subjected to a plasma nitriding treatment. An electromagnetic field is generated in the processing space S below the lower surface of the transmission window 20 to thereby turn the processing gas to plasma. Thus, the plasma nitriding treatment can be uniformly performed with reduced damage to a base film by using the plasma having a high density of $10^{10}$ to $10^{13}$ cm$^{-3}$ and a low electron temperature of 0.7 eV to 2.0 eV, preferably an electron temperature of 0.7 eV to 1 eV in the vicinity of the wafer W.

Conditions of the plasma nitriding treatment is selected to have, e.g., a pressure in the processing space S of 1 Pa to 50 Pa and preferably 7 to 12 Pa, a temperature of the wafer W of 100° C. to 400° C. and preferably 200° C. to 400° C., and an output power of the microwave supply device 36 of 500 W to 5000 W and preferably 1000 W to 2000 W. In the plasma nitriding treatment using the plasma processing apparatus 1, a rare gas such as krypton or helium may be used in place of the argon gas, and an ammonia gas may be used in place of the nitrogen gas.

Next, description will be made on an annealing apparatus for performing an annealing treatment in accordance with one embodiment of the present invention. The annealing treatment in the present invention can be performed by, e.g., a lamp-type annealing apparatus 51 shown in FIG. 2, although various kinds of other annealing apparatuses may be used for that purpose.

With the annealing apparatus 51, a transparent quartz glass plate 53 extends horizontally on an inner upper side of a processing vessel 52 and a heating source, e.g., a lamp 54, is arranged within a space between a cover part 52a and the quartz glass plate 53. The lamp 54 is operated by electric power supplied from a power supply 54a and is adapted to heat the wafer W in the processing vessel 52 to a predetermined temperature. Formed through a bottom portion of the processing vessel 52 is an evacuation port 56 that communicates with an exhaust device 55. A gas supply openings 57 is provided in a side wall of the processing vessel 52 below the quartz glass plate 53. Also provided in the side wall of the processing vessel 52 is a gate valve G through which the wafer W is conveyed into and out of the processing vessel 52.

Connected to the gas supply openings 57 are a nitrogen gas source supply 58 and an oxygen gas source supply 59, both of which serve as a processing gas source supply and are adapted to supply a nitrogen gas and an oxygen gas into the processing vessel 52 at a specified flow rate via valves 58a and 59a, mass flow controllers 58b and 59b and valves 58c and 59c. The wafer W is placed on support pins 60 provided on the bottom portion of the processing vessel 52.

The annealing apparatus 51 of the configuration set forth above is controlled by means of a controller 61. The controller 61 includes a central processing unit 62, a support circuit 63 and a storage medium 64 containing the relevant control software. By controlling, e.g., the valves 58a and 59a, the mass flow controllers 58b and 59b and the valves 58c and 59c of the nitrogen gas source supply 58 and the oxygen gas source supply 59, the controller 61 controls supply of a gas from the gas supply openings 57, stoppage of the gas supply, adjustment of a gas flow rate, a heating temperature achieved by the lamp 54, and evacuation of the processing vessel 52 by the exhaust device 55. The controller 71 performs control tasks required in the respective annealing treatment processes in the annealing apparatus 51.

The central processing unit 62 of the controller 61 may be a processor for use in a general purpose computer. The storage medium 64 may be various types of storage media including, e.g., a RAM, a ROM, a flexible disk and a hard disk. Furthermore, the support circuit 63 is connected to the central processing unit 62 in order to support the same in various kinds of support methods. The controller 61 may be used in common with the controller 71 for controlling the plasma processing apparatus 1.

In such an annealing apparatus 51, an annealing treatment is performed to the wafer W which has undergone the plasma nitriding treatment. Referring to treatment conditions, a mixture gas of, e.g., $N_2$ and $O_2$, is supplied from the gas supply openings 57, the processing vessel 2 is depressurized to, e.g., about 133 Pa (1 Torr), and the wafer W is heated to about 1000° C. Furthermore, the processing gas may be any other gas containing at least oxygen. It is preferred that the processing gas is diluted by, e.g., a nitrogen gas, in order to lower an oxygen partial pressure thereof. Moreover, ammonia or hydrogen may be added to the processing gas. In addition, the processing gas may be diluted with an inert gas such as an Ar gas or the like in place of the nitrogen gas.

Figure 3:
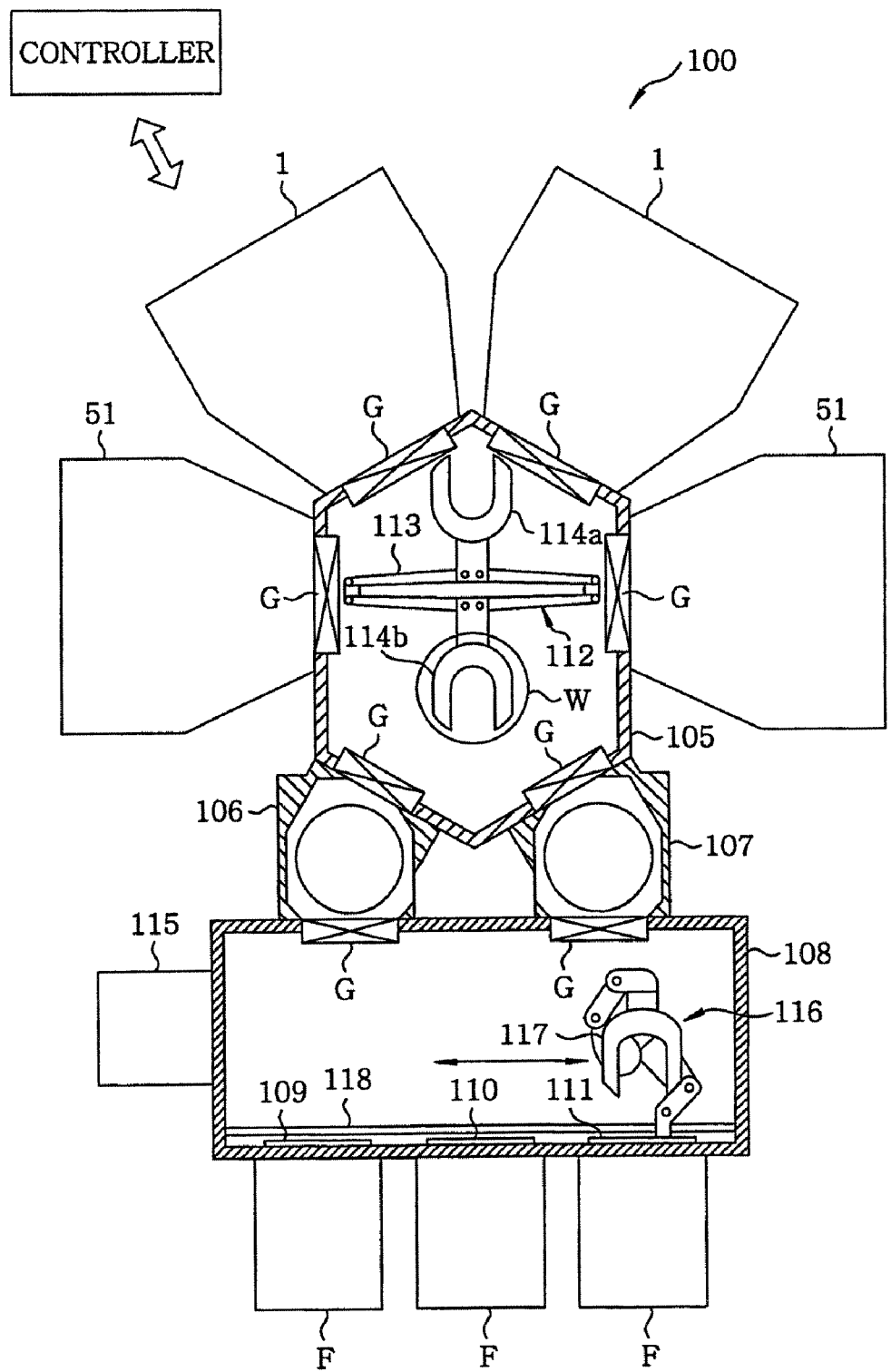
FIG. 3 is a schematic configuration diagram illustrating a multi-chamber type processing system provided with a plasma processing apparatus and an annealing apparatus for performing an insulating film forming method in accordance with one embodiment.

The plasma processing apparatus 1 and the annealing apparatus 51 described above are mounted to, e.g., a multi-chamber type processing system 100, as can be seen in FIG. 3. The processing system 100 includes, e.g., two plasma processing apparatuses 1 and two annealing apparatuses 51. Alternatively, it may be possible to employ a single plasma processing apparatus 1 and a single annealing apparatus 51, with other apparatuses used in combination.

The plasma processing apparatus 1 and the annealing apparatus 51 are provided in a corresponding relationship with four sides of a wafer transfer chamber 105 having a hexagonal shape when viewed from the top thereof. Furthermore, load lock chambers 106 and 107 are provided on two sides surfaces of the wafer transfer chamber 105. A wafer loading and unloading chamber 108 is provided on an opposite side of the load lock chambers 106 and 107 from the wafer transfer chamber 105. Ports 109, 110 and 111 are provided on an opposite side of the wafer loading and unloading chamber 108 from the load lock chambers 106 and 107 and, for example, three foups F for receiving the wafer W are attached the ports 109, 110 and 111.

As shown in FIG. 3, the plasma processing apparatus 1, the annealing apparatus 51 and the load lock chambers 106 and 107 are connected to the respective sides of the wafer transfer chamber 105 through gate valves G so that they can communicate with the wafer transfer chamber 105 when the gate valves G are opened and can be interrupted from the wafer transfer chamber 105 when the gate valves G are closed. Gate valves G are also provided in the portions of the load lock chambers 106 and 107 that make connection with the wafer loading and unloading chamber 108. The load lock chambers 106 and 107 communicate with the wafer loading and unloading chamber 108 when the gate valves G are opened and are interrupted from the wafer loading and unloading chamber 108 when the gate valves G are closed.

Provided in the wafer transfer chamber 105 is a wafer transfer device 112 that performs loading and unloading of the wafer W as a processing object with respect to the plasma processing apparatus 1, the annealing apparatus 51 and the load lock chambers 106 and 107. The wafer transfer device 112 is arranged substantially at the center of the wafer transfer chamber 105 and includes a rotating and retracting portion 113 that can make rotating, extending and retracting movement. At the tip ends of the rotating and retracting portion 113, there are provided two blades 114a and 114b for holding the wafer W. The two blades 114a and 114b are attached to the rotating and retracting portion 113 so that they can be oriented in mutually opposite directions. Moreover, the interior of the wafer transfer chamber 105 is kept at a specified vacuum degree.

A HEPA filter (not shown) is provided in a ceiling portion of the wafer loading and unloading chamber 108. A clean air which has passed the HEPA filter is supplied into the wafer loading and unloading chamber 108 in a down-flow state to ensure that the tasks of loading and unloading the wafer W are carried out under an atmospheric pressure and in a clean-air atmosphere. Shutters (not shown) are respectively provided in the three ports 109, 110 and 111 of the wafer loading and unloading chamber 108 for attachment of the foups F. The foups F, either filled with the wafer W or remaining empty, are directly attached to the ports 109, 110 and 111, in which process the shutters are bent back so that the foups F can communicate with the wafer loading and unloading chamber 108 while preventing infiltration of an external air. Furthermore, an alignment chamber 115 is provided on one side surface of the wafer loading and unloading chamber 108 and alignment of the wafer W is performed in the alignment chamber 115.

In the wafer loading and unloading chamber 108, there is provided a wafer transfer device 116 that performs loading and unloading of the wafer W with respect to the foups F and the load lock chambers 106 and 107. The wafer transfer device 116 has a multi-articulated arm structure and is capable of moving along a rail 118 in an arrangement direction of the foups F. The wafer transfer device 116 is adapted to transfer the wafer W by holding the wafer W with a hand 117 provided at the tip end thereof.

Individual constituent parts of the processing system 100 are controlled by a control unit 81 including the controller 61 and the controller 71.

In this processing system 100, one piece of wafer W is first taken out from one of the foups F and loaded into the alignment chamber 115 by means of the wafer transfer device 116 in the wafer loading and unloading chamber 108 which is kept under an atmospheric pressure and in a clean-air atmosphere, after which position alignment of the wafer W is performed in the alignment chamber 115. Then, the wafer W is loaded into one of the load lock chambers 106 and 107 which in turn is evacuated into a vacuum state. Thereafter, the wafer W in the corresponding load lock chamber is taken out and loaded into the plasma processing apparatus 1 by a wafer transfer device 112 in the wafer transfer chamber 105. Subsequently, the wafer W is subjected to a specified plasma nitriding treatment.

The wafer W which has undergone the plasma nitriding treatment is unloaded from the plasma processing apparatus 1 and returned to the wafer transfer chamber 105 by means of the wafer transfer device 112 in the wafer transfer chamber 105. Thereafter, the wafer W is loaded into the annealing apparatus 51 by the wafer transfer device 112 and is subjected to a light annealing treatment in accordance with the below-mentioned embodiment. Accordingly, the wafer W is transported, in a depressurized atmosphere and with no exposure to the ambient air, from the plasma processing apparatus 1 for performing the plasma nitriding treatment to the annealing apparatus 51 for carrying out the annealing treatment. This means that the plasma nitriding treatment and the next annealing treatment can be performed continuously. The wafer W which has undergone the annealing treatment is loaded into one of the load lock chambers 106 and 107 by means of the wafer transfer device 112. After the corresponding load lock chamber has been restored into an atmospheric pressure, the wafer W is taken out from the load lock chamber and received in one of the foups F by means of the wafer transfer device 116 in the wafer loading and unloading chamber 108. These operations are performed with respect to at least one wafer, e.g., one lot of wafers, thus terminating one set of treatments.

Next, description will be given to an insulating film forming method in accordance with the present embodiment. First, a plasma nitriding treatment is performed to a silicon oxide film on the wafer W using the plasma processing apparatus 1 described earlier, thereby forming a SiON film. Subsequently, the wafer W which has been subjected to the plasma nitriding treatment is loaded into the processing vessel 52 of the annealing apparatus 51 and placed on the support pins 60.

Then, evacuation is performed through the evacuation port 56 and a specified treatment gas is supplied from the treatt gas source supply to the processing vessel 52. In the present embodiment, a nitrogen-oxygen mixture gas flows at a pre-determined flow rate. At this time, the annealing treatment is performed by keeping the oxygen partial pressure at 66.7 Pa(0.5 Ton) and preferably 13.3 Pa to 93.3 Pa and maintaining the pressure in the processing vessel 52 at 667 Pa (5 Ton) and preferably 66.7 Pa to 933.2 Pa. Thus, there is formed a gate insulating film that does not suffer from an increase in thickness and exhibits a good ON-current characteristic ($I_{on}$) and an improved mutual conductance (Gm: a ratio of a change in a gate voltage to a change in a drain current).

Figure 4:
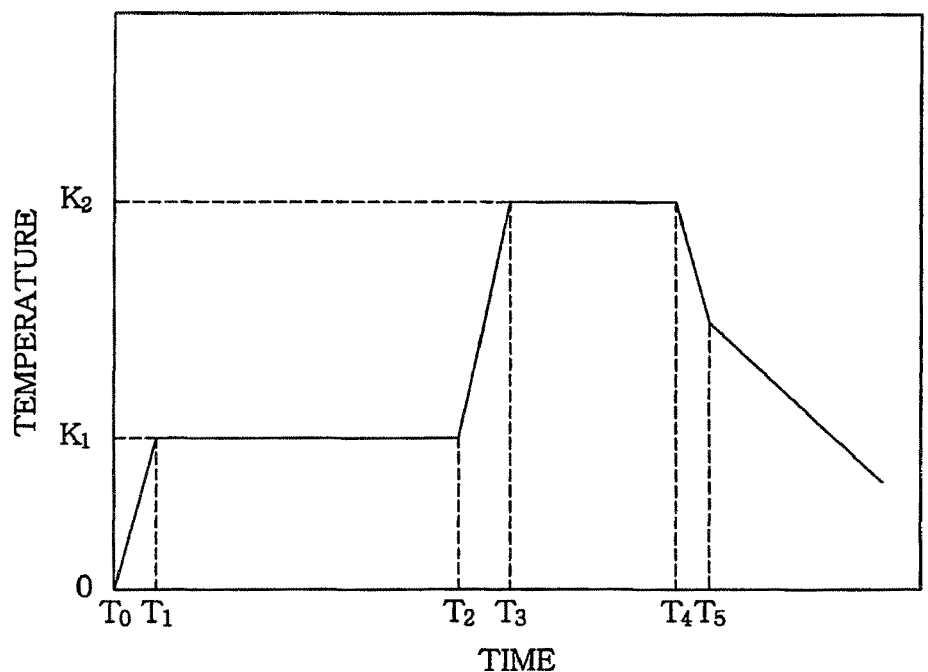
FIG. 4 is an explanatory view illustrating a sequence of an annealing treatment in accordance with one embodiment.

Next, an annealing temperature and an annealing time will be described in detail. In the present embodiment, a heat treatment is conducted according to a sequence as illustrated in FIG. 4. That is to say, the temperature of the wafer W is first elevated to an annealing temperature $K_1$ in a section of $T_0$-$T_1$ (a first temperature elevation step) and then kept at the annealing temperature $K_1$ in a section of $T_1$-$T_2$ which is a first annealing treatment step. In this case, the section of $T_1$-$T_2$ is 1 to 60 seconds and preferably 20 to 40 seconds and the annealing temperature $K_1$ is preferably 600° C. to 700° C. Then, the temperature of the wafer W is elevated to an annealing temperature $K_2$ in a section of $T_2$-$T_3$ (a second temperature elevation step). In the present embodiment, the heat-up rate in the section of $T_2$-$T_3$ is 100° C./sec.

The annealing temperature $K_2$ is preferably 950° C. to 1150° C. Thereafter, a second annealing treatment step of keeping the annealing temperature $K_2$ constant is performed in a section of $T_3$-$T_4$. The section of $T_3$-$T_4$ is 1 to 40 seconds and preferably 5 to 30 seconds. If an annealing treatment is performed by straightforwardly elevating the wafer temperature up to 1000° C., damage of a thermal budget such as a warp or a slip of the wafer W occurs. In contrast, an improved annealing treatment can be achieved by performing low temperature annealing in the first annealing treatment step and then conducting high temperature annealing in the second annealing treatment step.

At the end of the second annealing treatment step, the temperature of the wafer W is first rapidly lowered to, e.g., 600° C., in a section of $T_4$-$T_5$ (a first temperature lowering step). Then, the temperature of the wafer W is gently lowered from a time point of $T_5$ (a second temperature lowering step).

Figure 5:
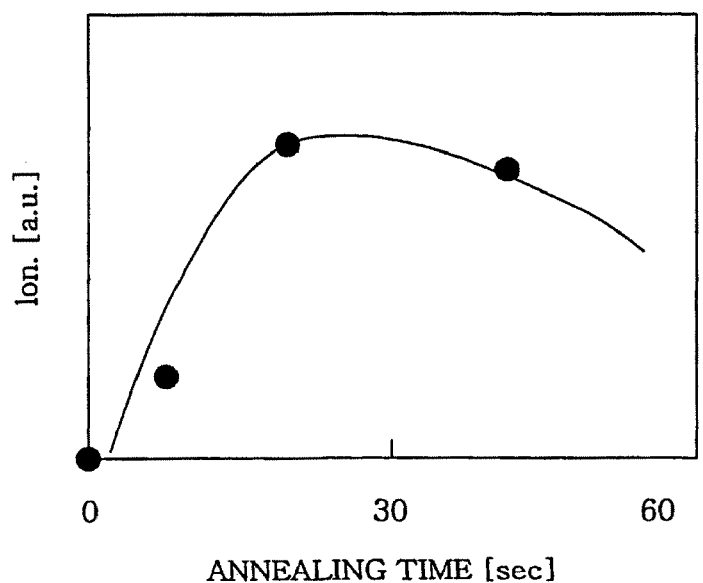
FIG. 5 is a graph representing the relationship between an annealing time and an ON-current characteristic for an insulating film formed by one embodiment.

Next, description will be shifted to the results of an annealing treatment empirically conducted by the present inventors (characteristics of the oxynitride film formed in accordance with the embodiment). In this annealing treatment, the oxygen partial pressure is 66.75 Pa (0.5 Torr) and the annealing temperature $K_2$ is 1050° C. FIG. 5 shows the relationship between an annealing time and an ON-current characteristic ($I_{ON}$) in case of manufacturing a transistor that uses the oxynitride film as a gate insulating film. From the relationship shown in FIG. 5, it can be seen that the annealing time ($T_3$-$T_4$) in the second annealing treatment step is preferably 5 to 60 seconds and more preferably 10 to 40 seconds and further that the ON-current characteristic ($I_{ON}$) reaches substantially a peak when the annealing time is 20 seconds.

Figure 6:
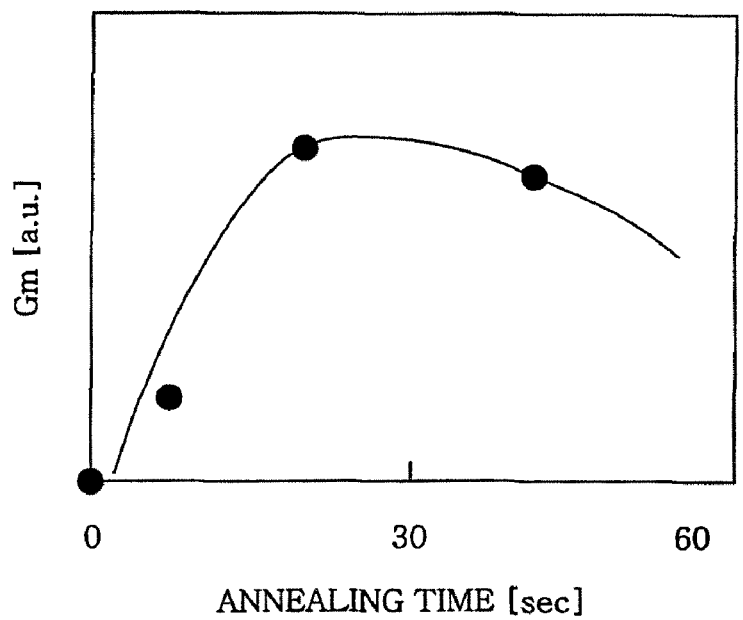
FIG. 6 is a graph representing the relationship between an annealing time and a mutual conductance for an insulating film formed by one embodiment.

Referring to the relationship between an annealing time and a mutual conductance (Gm: a ratio of a change in a gate voltage to a change in a drain current) illustrated in FIG. 6, it can be appreciated that the annealing time ($T_3$-$T_4$) in the second annealing treatment step is preferably 5 to 60 seconds and more preferably 20 to 40 seconds and further that the mutual conductance Gm reaches substantially a peak when the annealing time is 20 seconds.

Figure 7:
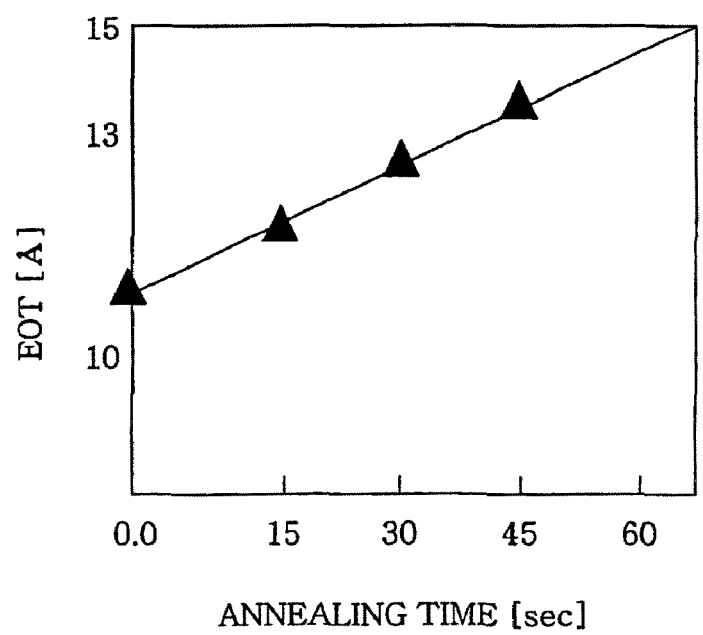
FIG. 7 is a graph representing the relationship between an annealing time and a film thickness for an insulating film formed by one embodiment.

Referring next to the relationship between an annealing time and a film thickness (EOT (Equivalent Oxide Thickness): a film thickness in terms of an oxide film) illustrated in FIG. 7, the annealing time ($T_3$-$T_4$) in the second annealing treatment step is preferably equal to or shorter than 60 seconds and the film thickness EOT becomes 12 to 13 Angstrom, which falls within a permissible range, when the annealing time is 5 to 45 seconds. Thus, a desired result is obtained.

Figure 8:
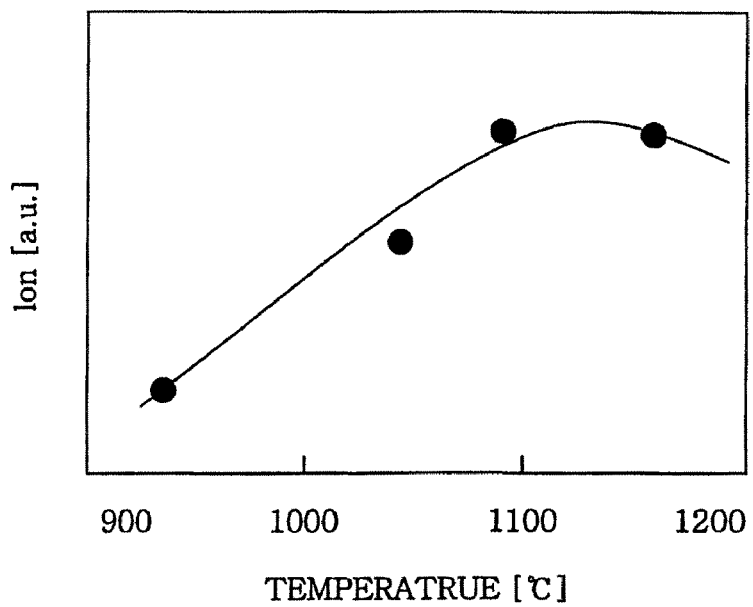
FIG. 8 is a graph representing the relationship between an annealing temperature and an ON-current characteristic for an insulating film formed by one embodiment.

Illustrated in FIG. 8 is a change in an ON-current characteristic when the annealing temperature $K_2$ was changed while keeping the oxygen partial pressure and the flow rate of nitrogen/oxygen gases unchanged and setting the annealing time ($T_3$-$T_4$) in the second annealing treatment step to 30 seconds. It can be seen in FIG. 8 that the annealing temperature $K_2$ is preferably 900° C. to 1200° C. and more preferably 1050° C. to 1150° C. and further that the ON-current characteristic reaches substantially a peak when the annealing temperature $K_2$ is 1100° C. to 1150° C.

Figure 9:
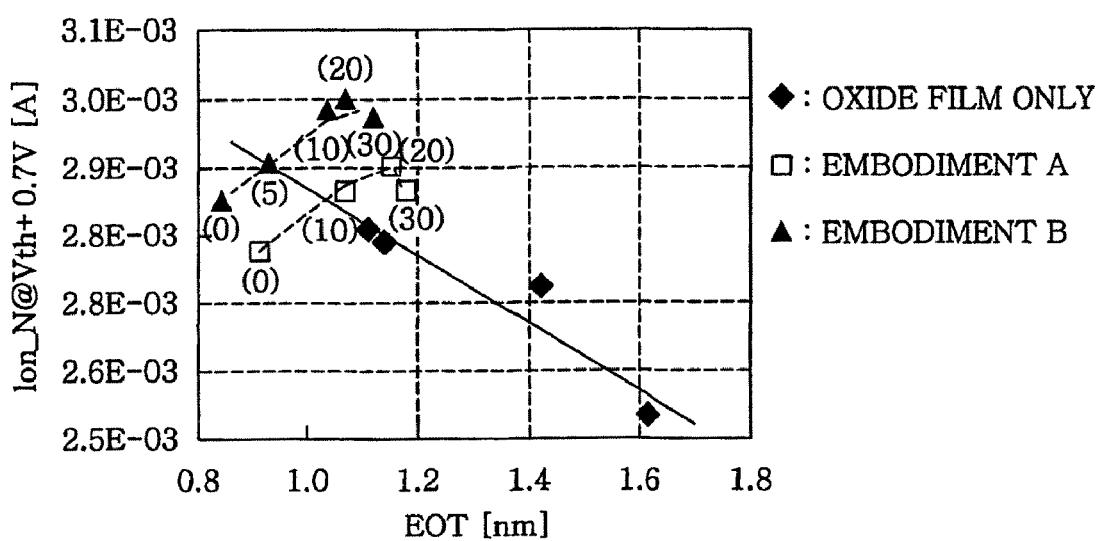
FIG. 9 is a graph representing the relationship between a film thickness and an ON-current characteristic for an insulating film formed by one embodiment.

FIG. 9 illustrates a film thickness EOT and an ON-current characteristic when the annealing temperature is 1050° C. and 1100° C. and when the annealing time in the second annealing treatment step is 0, 10, 20, 30 and 45 seconds. In FIG. 9, the numerals in parentheses lying near triangular and rectangular dots are for the annealing time in the second annealing treatment step. As an example, "(5)" represents that the annealing is performed for 5 seconds. Furthermore, the triangular and rectangular dots denote that the plasma nitriding treatments are carried out in different conditions. The annealing treatments after these plasma nitriding treatments are performed in accordance with the embodiments of the present invention. In embodiment A, the ion energy at the time of plasma nitriding treatment is 3 eV and the annealing temperature is 1100° C. In embodiment B, the ion energy at the time of plasma nitriding treatment is 5 eV and the annealing temperature is 1050° C. In both embodiments, the nitrogen concentrations after the plasma nitriding treatment were controlled to 10.0 atomic %. The results show that, when the annealing time ($T_3$-$T_4$) in the second annealing treatment step is 10 to 30 seconds, it is possible in both embodiments to realize an ON-current characteristic higher than that in case of the oxide film only, while reducing the film thickness to below 1.2 nm.

In case the annealing temperature is 1050° C. and 1100° C., an ON-current characteristic ($I_{ON}$) better than that in case of using a thermal oxide film (an oxide film formed by a heat treatment in a steam atmosphere) was obtained when the annealing time ($T_3$-$T_4$) in the second annealing treatment step is 10 seconds or more. Furthermore, the annealing temperature is preferably 950° C. to 1150° C. and the annealing time ($T_3$-$T_4$) in the second annealing treatment step is preferably 5 to 60 seconds. The film thickness EOT can be made thinner by the annealing treatment. In case the film thickness EOT is equal to or smaller than 1.2 nm, the annealing time ($T_3$-$T_4$) in the second annealing treatment step is preferably 10 to 60 seconds.

In the event that an oxide film on a silicon substrate is subjected to a nitriding treatment, nitrogen is diffused to an interface between the oxide film and Si of the substrate, thereby causing damage to the interface. By performing an annealing treatment after a nitriding treatment in two steps of low temperature annealing and high temperature annealing at an elevated temperature and within a short period of time as in the present invention, re-oxidation occurs in the interface between the oxide film and Si, which makes it possible to recover the damage and form a good interface.

Figure 10:
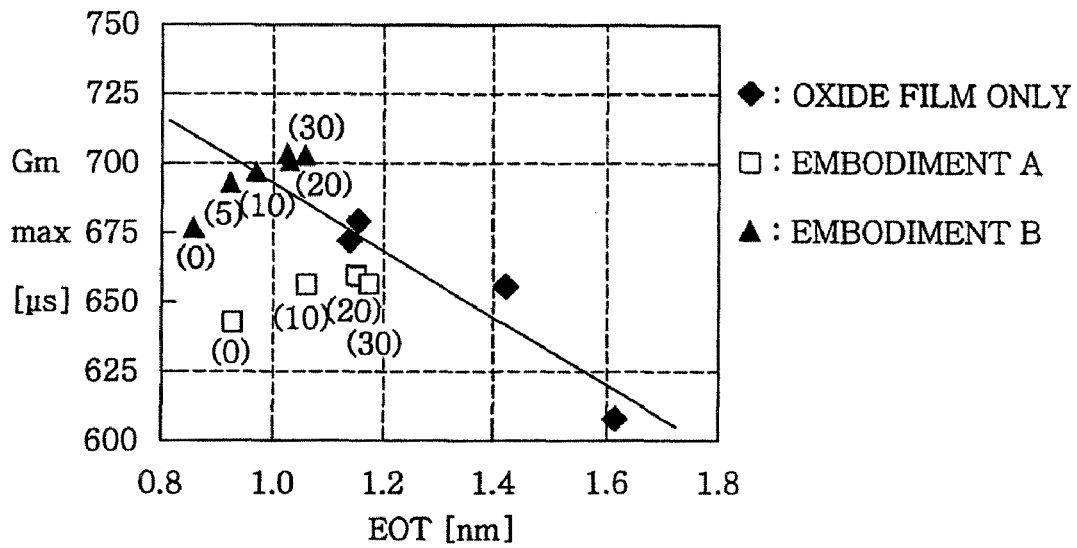
FIG. 10 is a graph representing the relationship between a film thickness and a mutual conductance characteristic for an insulating film formed by one embodiment.

Turning to the film thickness EOT and the mutual conductance Gm illustrated in FIG. 10, the mutual conductance Gm in the annealing treatment performed at 1100° C. (Embodiment A) becomes inferior to that in case of the oxide film only. However, in the annealing treatment performed at 1050° C. (Embodiment B), an acceptable result was obtained when the annealing time ($T_3$-$T_4$) in the second annealing treatment step is 10 seconds or more. Therefore, if the film thickness EOT is equal to or smaller than 1.2 nm, the annealing treatment in the second annealing treatment step is performed preferably at the annealing temperature $K_2$ of 1100° C. and the annealing time ($T_3$-$T_4$) is preferably 10 seconds or more. More preferably, the annealing temperature $K_2$ is 1050° C. or less. It is presumed that, by doing so, the interface between the oxide film and silicon is re-oxidized and brought into a good state. Moreover, when the film thickness is 1.2 nm or less and the annealing time ($T_3$-$T_4$) is 10 to 30 seconds, it was possible to realize a mutual conductance Gm of as high as 70 μsec (Embodiment B).

Figure 11:
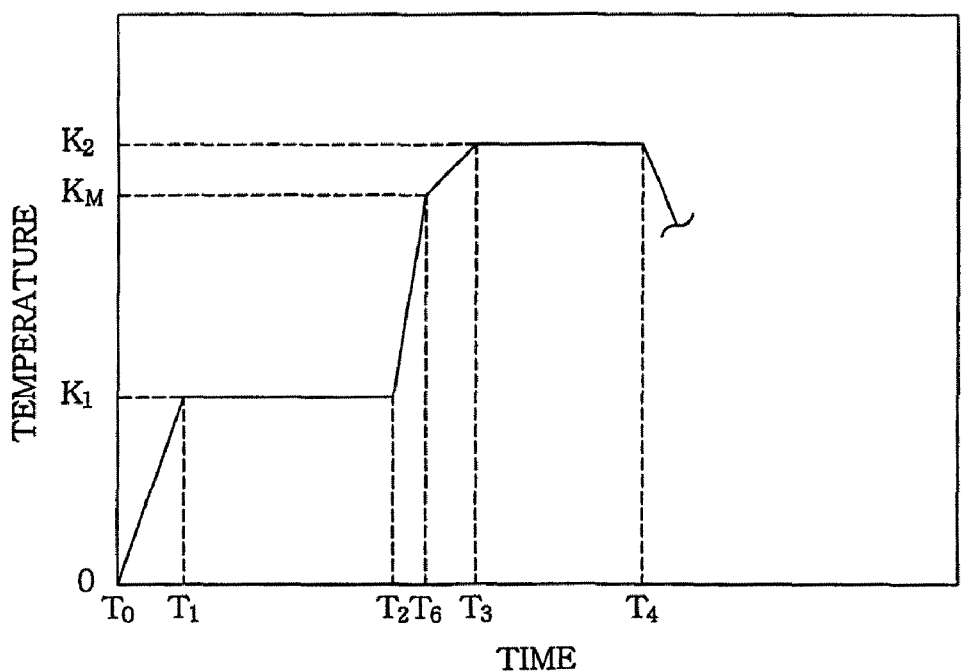
FIG. 11 is an explanatory view illustrating a sequence of an annealing treatment in accordance with another embodiment.

Although detailed description will be offered later in respect of additional embodiments, the temperature elevation in the section of $T_2$-$T_3$ can be performed in two or more steps at different heat-up rates. More specifically, as illustrated in FIG. 11, the wafer W is heated up at a second heat-up rate in a section of $T_2$-$T_6$ (a former elevation period of the second temperature elevation step) in which the wafer temperature is elevated from the annealing temperature $K_1$ of the first annealing treatment step to an intermediate temperature $K_M$ lower than the annealing temperature $K_2$ of the second annealing treatment step. Furthermore, the wafer W is heated up at a third heat-up rate slower than the second heat-up rate in a section of $T_6$-$T_3$ (a latter elevation period of the second temperature elevation step) in which the wafer temperature is elevated from the intermediate temperature $K_M$ to the annealing temperature $K_2$. In this regard, the intermediate temperature $K_M$ is defined to satisfy the following equation:

$$3 \leq (K_2 - K_M)/Y \leq 7,$$

where Y denotes a temperature elevation breadth per second in the third heat-up rate.

If the $(K_2-K_M)/Y$ is smaller than 3 in the above equation, the time required in the latter elevation period of the second temperature elevation step becomes too short in terms of the heat-up rate, thereby generating an overshoot. This increases the possibility of generating a warp or a slip in the wafer W and therefore is undesirable. In contrast, if the $(K_2-K_M)/Y$ exceeds 7 in the above equation, the time required in the latter elevation period of the second temperature elevation step becomes too long in terms of the heat-up rate. This reduces a treatment throughput and therefore is undesirable. For the reasons stated above, it is preferred that the intermediate temperature $K_M$ be set at, e.g., 85% to 95% of the annealing temperature $K_2$ in the second annealing treatment step, i.e., the heat treatment temperature.

In this case, the second heat-up rate in the former elevation period of the second temperature elevation step is made higher than the third heat-up rate in the latter elevation period thereof. This is because the heat-up rate in the former elevation period of the second temperature elevation step should preferably be made as high as possible mainly for the purpose of improving a throughput. However, if the wafer W is heated up to the annealing temperature $K_2$ at an increased heat-up rate, an overshoot occurs and an in-plane heating speed of the wafer W grows uneven due to a rapid temperature variation. Thus, a thermal stress (strain) is applied to the wafer W, thereby generating a warp or a slip which is a crystal defect. For the above reasons, by providing the latter elevation period after the former elevation period of the second temperature elevation step, the heat-up rate of which is smaller than that of the former elevation period, it is possible to avoid occurrence of the overshoot, make the in-plane heating speed of the wafer W uniform and prevent generation of the warp or slip of the wafer W.

It is also preferred that the second heat-up rate in the former elevation period of the second temperature elevation step be equal to or greater than the first heat-up rate in the section of $T_0$-$T_1$ (the first temperature elevation step). Although the wafer W is heated up to 600° C. to 700° C. in the first temperature elevation step, a warp is likely to occur in the wafer W during this heat-up process. Therefore, if the first heat-up rate in the first temperature elevation step is too great, the in-plane heating speed of the wafer W becomes uneven, which may sometimes be a cause of generating a warp, a slip or the like in the wafer W.

Accordingly, the first heat-up rate in the first temperature elevation step is set at a value equal to or smaller than the third heat-up rate in the latter elevation period of the second temperature elevation step. Preferably, the first heat-up rate is set to have a smallest value among the heat-up rates employed in the three temperature elevation steps.

As described above, with a view to increase a throughput and reduce a thermal budget while preventing occurrence of an overshoot and generation of a warp or a slip in the wafer W, the heat-up rates in the first temperature elevation step, the former elevation period of the second temperature elevation step and the latter elevation period of the second temperature elevation step are preferably set to ensure that the second heat-up rate in the former elevation period of the second temperature elevation step is greater than the third heat-up rate in the latter elevation period of the second temperature elevation step and the third heat-up rate is equal to or greater than the first heat-up rate in the first temperature elevation step. As a specific example, the second heat-up rate in the former elevation period of the second temperature elevation step is preferably 40 to 60° C./sec, the third heat-up rate in the latter elevation period of the second temperature elevation step is preferably 15 to 30° C./sec, and the first heat-up rate in the first temperature elevation step is preferably 5 to 15° C./sec.

Figure 12:
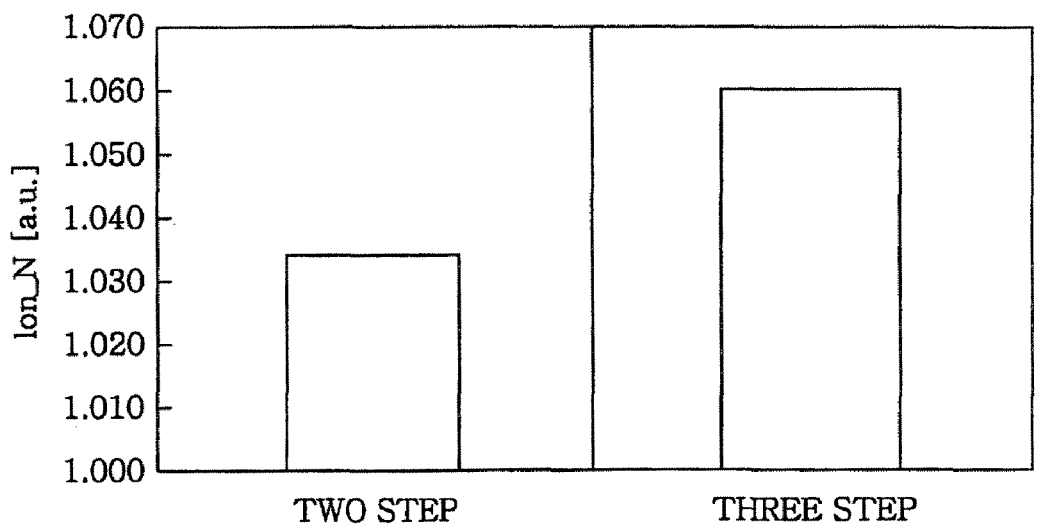
FIG. 12 is a graph representing an ON-current characteristic for an insulating film formed by another embodiment.
Figure 13:
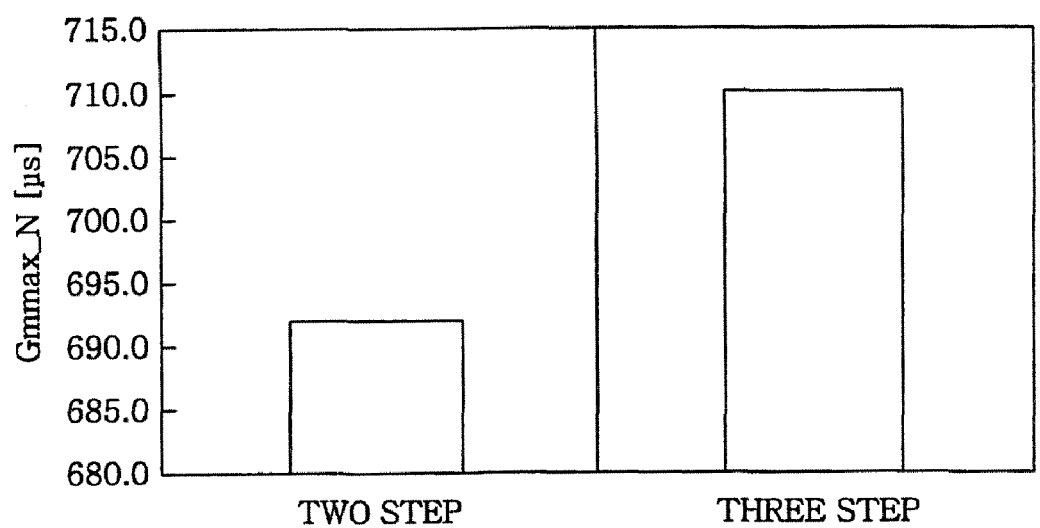
FIG. 13 is a graph representing a mutual conductance characteristic for an insulating film formed by another embodiment.

FIGS. 12 and 13 are views comparatively illustrating an ON-current characteristic ($I_{ON}$) and a mutual conductance Gm measured for a transistor which includes an oxynitride film as a gate insulating film, in case of subjecting the oxynitride film to the two-step heat-up annealing as shown in FIG. 4 and in case of subjecting the oxynitride film to the three-step heat-up annealing as depicted in FIG. 11. The ON-current characteristic ($I_{ON}$) illustrated in FIG. 12 is a value standardized based on the ON-current characteristic of an oxide film.

In this experiment, a silicon oxide ($SiO_2$) film formed on a wafer W in a film thickness of 1 nm by a water vapor generation (WVG) thermal oxidation treatment was first subjected to a plasma nitriding treatment using the plasma processing apparatus 1 as shown in FIG. 1, to thereby form a silicon oxynitride (SiON) film. Referring to conditions of the plasma nitriding treatment at this time, a processing gas consisting of Ar and $N_2$ was introduced into the processing vessel 2 in an Ar/$N_2$ flow rate ratio of 1000/40 mL/min (sccm), with a microwave output power of 1.5 kW, a pressure in the processing vessel 2 of 6.7 Pa (50 mTorr) and a treatment temperature of 400° C.

Figure 2:
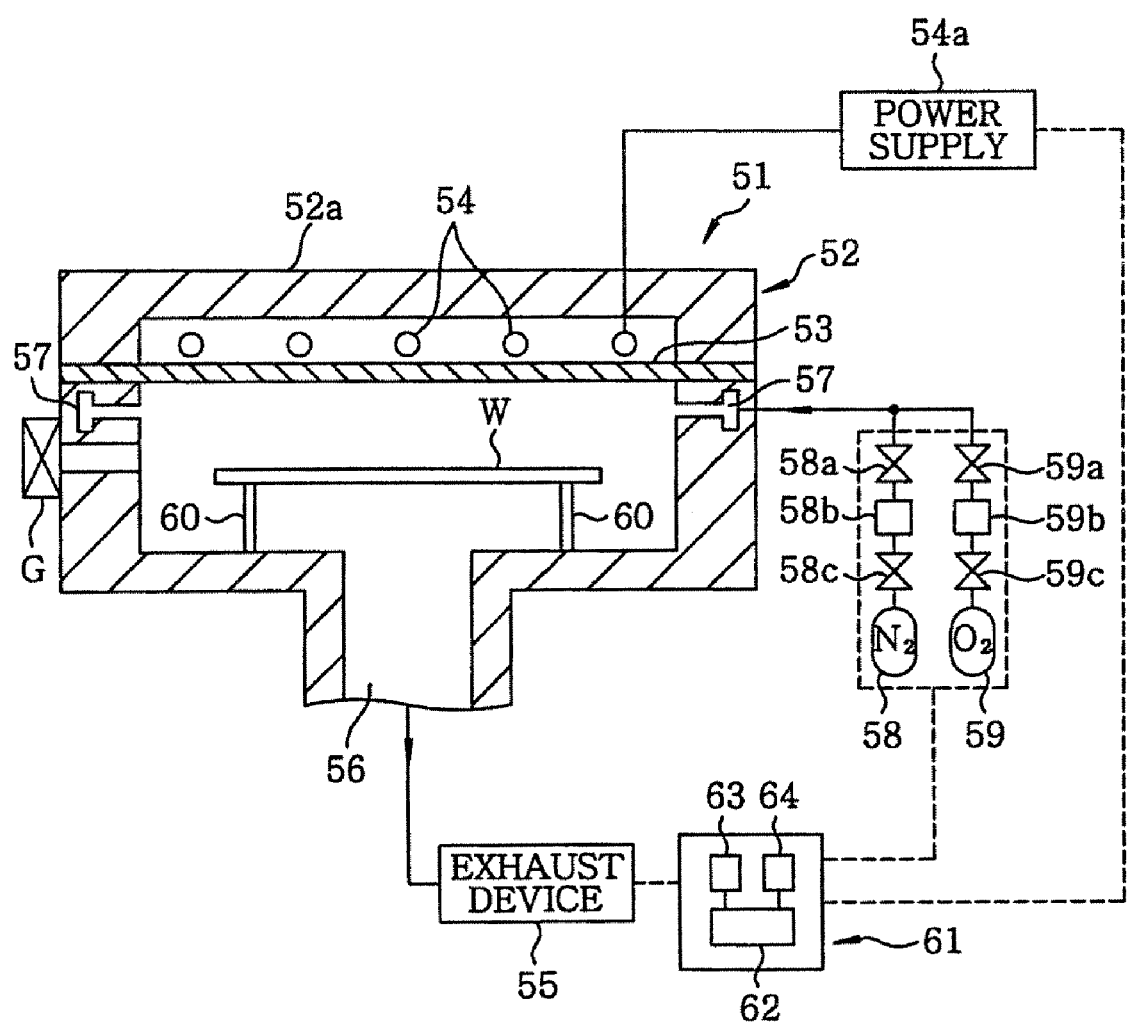
FIG. 2 is an explanatory vertical section view showing an annealing apparatus for performing a method in accordance with one embodiment.

Then, the wafer W on which the silicon oxynitride (SiON) film has been formed was subjected to an annealing treatment using the annealing apparatus 51 as shown in FIG. 2, with a heat treatment temperature (annealing temperature $K_2$) of 1000° C. and a treatment pressure of 133.3 Pa (1 Torr). At this time, a processing gas consisting of $O_2$ and $N_2$ was introduced into the processing vessel 52 in an $O_2$/$N_2$ flow rate ratio of 1/1 L/min (slm) and the annealing was performed for a total time of 20 seconds.

Referring to FIGS. 12 and 13, the "two-step" annealing was performed by heating up the wafer W to 700° C. (annealing temperature $K_1$) at a predetermined heat-up rate for 30 seconds, keeping the wafer W at 700° C. for 40 seconds, straightforwardly heating up the wafer W to 1000° C. (annealing temperature $K_2$: a heat treatment temperature) at a heat-up rate of 50° C./sec for 6 seconds and then maintaining the wafer W at 1000° C. for 20 seconds.

In case of the "three-step" annealing, the wafer W was heated up to 700° C. (annealing temperature $K_1$) at a predetermined heat-up rate for 30 seconds and then kept at 700° C. for 40 seconds. In this case, it is preferred that the total sum of the heat-up time and the keeping time be 70 seconds. Thereafter, the wafer W was heated up to 900° C. (annealing temperature $K_M$: an intermediate temperature) at a heat-up rate of 50° C./sec for 4 seconds and then to 1000° C. at a decelerated heat-up rate of 20° C./sec for 5 seconds. The wafer W was kept at 1000° C. for 20 seconds to complete the annealing.

A transistor having a gate electrode was manufactured by using, as a gate insulating film thereof, the SiON film which has been subjected to the nitriding treatment and then the annealing treatment as described above. Electric characteristics were evaluated for the transistor thus manufactured.

As illustrated in FIGS. 12 and 13, both the mutual conductance Gm and the ON-current characteristic ($I_{ON}$) obtained in the three-step heat-up annealing treatment are greater than those available in the two-step heat-up annealing treatment. Thus, it has been confirmed that electric characteristics of a semiconductor device can be further improved by performing the three-step heat-up annealing treatment.

As is apparent from the foregoing, the annealing treatment according to the present invention is performed at a pressure of 667 Pa or less and not under an atmospheric pressure which is used in the prior art annealing. Thus, an ON-current characteristic and a mutual conductance characteristic of a transistor can be improved while reducing the thickness of a gate insulating film of the transistor and inhibiting degradation of a NBTI characteristic.

Figure 14:
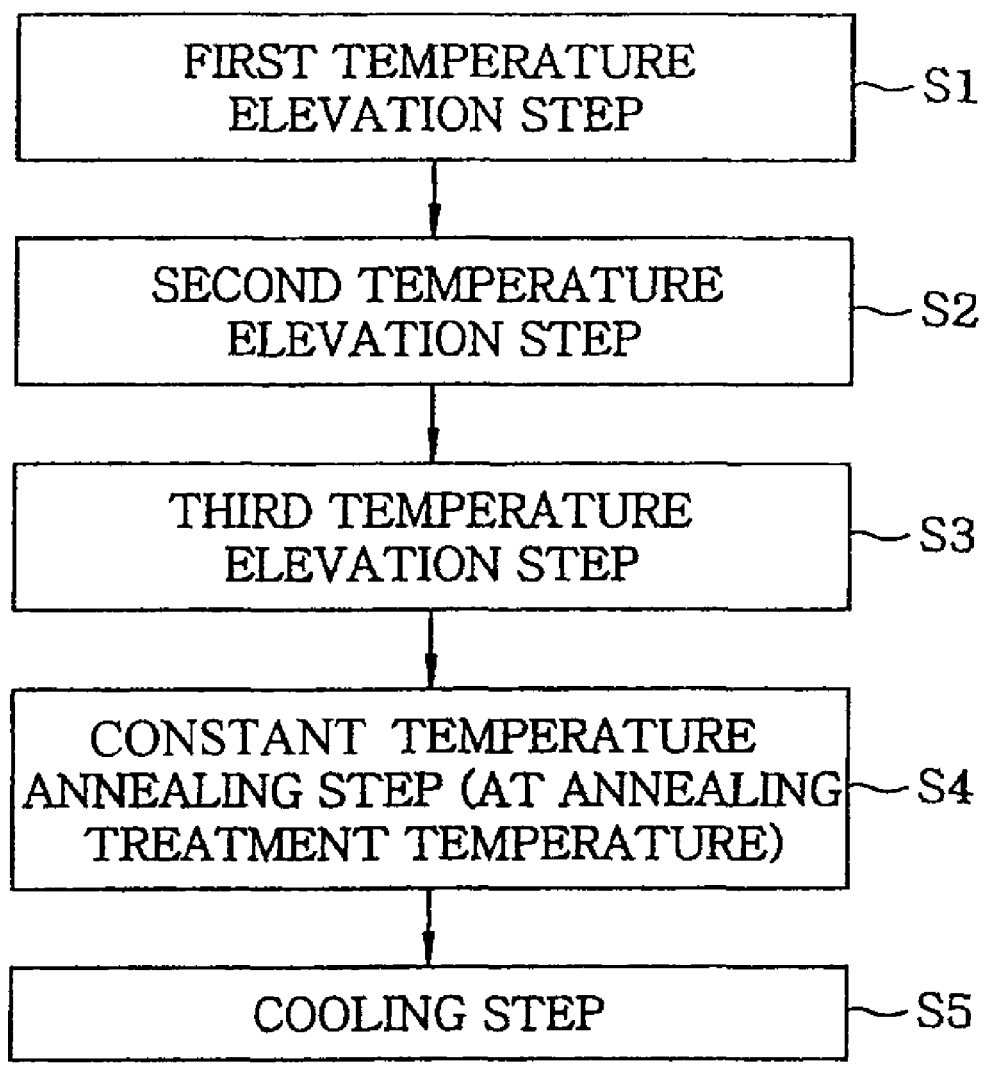
FIG. 14 is a flowchart for explaining a procedure of a heat treatment method which is one embodiment of the substrate processing method.

FIG. 14 is a flowchart for explaining an outline of a heat treatment method which is one example of the substrate processing method in accordance with the present invention The heat treatment method of the present embodiment is directed to a method by which an object substrate is heat-treated at a heat treatment temperature of 800° C. or more within a processing chamber of a substrate processing apparatus. The heat treatment method is characterized in that it has a three-step heat-up process including steps S1 to S3 among the five steps illustrated in FIG. 14.

In a first temperature elevation step S1, an object substrate is heated up to a first temperature at which emissivity of the object substrate becomes greatest. In this connection, the emissivity of the object substrate varies with the kind of the object substrate or the kind of a film formed on the surface thereof and becomes greatest at about 600° C. in case of, e.g., a silicon wafer. This means that, if the object substrate is a silicon wafer, a target temperature (first temperature) in the first temperature elevation step S1 is 600° C. to 700° C. With regard to object substrates other than the silicon wafer, the first temperature can be set depending on the emissivity thereof. It is preferred that, when reached the first temperature, the object substrate be kept for, e.g., 10 to 60 seconds to assure temperature stabilization.

In a second temperature elevation step S2, the object substrate is heated up to a second temperature lower than a heat treatment temperature from the first temperature at which emissivity of the object substrate becomes greatest. In this regard, the second temperature X is defined to satisfy the following equation:

$$3 \leq (T-X)/Y \leq 7,$$

where T denotes the heat treatment temperature and Y is a temperature elevation breadth per second in the third heat-up rate.

If the (T−X)/Y is smaller than 3 in the above equation, the third temperature elevation step becomes too short in terms of the heat-up rate thereof, thereby generating an overshoot. This increases the possibility of generating a warp or a slip in the object substrate and therefore is undesirable. In contrast, if the (T−X)/Y exceeds 7 in the above equation, the third temperature elevation step becomes too long in terms of the heat-up rate thereof. This reduces a treatment throughput and therefore is undesirable. For the reasons stated above, it is preferred that the second temperature X be set at, e.g., 85% to 95% of the heat treatment temperature T.

In a third temperature elevation step S3, the object substrate is heated up from the second temperature to the heat treatment temperature. The heat treatment temperature is not particularly limited as long as it is equal to or higher than 800° C. For example, the heat treatment temperature may be about 800° C. to 1100° C. and preferably 900° C. to 1100° C. In this case, the second temperature may be, e.g., 590° C. to 1010° C. and preferably 690° C. to 1010° C.

Next, in step S4, a constant temperature annealing treatment is performed at the heat treatment temperature (e.g., 800° C. to 1100° C.) noted above. In step S5, the temperature of the object substrate is lowered down from the heat treatment temperature at a specified cooling rate, thereby terminating the heat treatment.

In the first to third temperature elevation steps S1, S2 and S3 described above, the heat-up rate of the second temperature elevation step S2 is made higher than the heat-up rate of the third temperature elevation step S3. This is because the heat-up rate of the second temperature elevation step S2 should preferably be made as high as possible mainly for the purpose of improving a throughput. However, if the object substrate is heated up to the heat treatment temperature at an increased heat-up rate, an overshoot occurs and an in-plane heating speed of the object substrate grows uneven due to a rapid temperature variation. Thus, a thermal stress (strain) is applied to the object substrate, thereby generating a warp or a slip which is a crystal defect. For the above reasons, by providing the third temperature elevation step after the second temperature elevation step, the heat-up rate of which is smaller than that of the second temperature elevation step, it is possible to avoid occurrence of the overshoot, make the in-plane heating speed of the object substrate uniform and prevent generation of the warp or slip of the object substrate.

It is also preferred that the heat-up rate of the third temperature elevation step be equal to or greater than the heat-up rate of the first temperature elevation step. Although the object substrate is heated up in the first temperature elevation step to the temperature (first temperature) at which emissivity of the object substrate becomes greatest, a warp is likely to occur in the object substrate during this heat-up process. Therefore, if the heat-up rate in the first temperature elevation step is excessively great, the in-plane heating speed of the object substrate becomes uneven, which may sometimes be a cause of generating a warp, a slip or the like in the object substrate.

Accordingly, the heat-up rate in the first temperature elevation step is set at a value equal to or smaller than the heat-up rate in the third temperature elevation step. Preferably, the heat-up rate in the first temperature elevation step is set to have a smallest value among the heat-up rates employed in the three temperature elevation steps.

As described above, with a view to increase a throughput and reduce a thermal budget while preventing occurrence of an overshoot and generation of a warp or a slip in the object substrate, the heat-up rates in the first to third temperature elevation steps are preferably set to ensure that the heat-up rate of the second temperature elevation step is greater than the heat-up rate of the third temperature elevation step and further that the heat-up rate of the third temperature elevation step is equal to or greater than the heat-up rate of the first temperature elevation step. As a specific example, the heat-up rate of the second temperature elevation step is preferably 40 to 60° C./sec, the heat-up rate of the third temperature elevation step is preferably 15 to 30° C./sec, and the heat-up rate of the first temperature elevation step is preferably 5 to 15° C./sec.

The heat treatment method of the present embodiment is applicable to a heat treatment performed in a pressure range of from a vacuum pressure to a normal pressure. For example, the treatment pressure is preferably 106.66 Pa to 101325 Pa.

Figure 15:
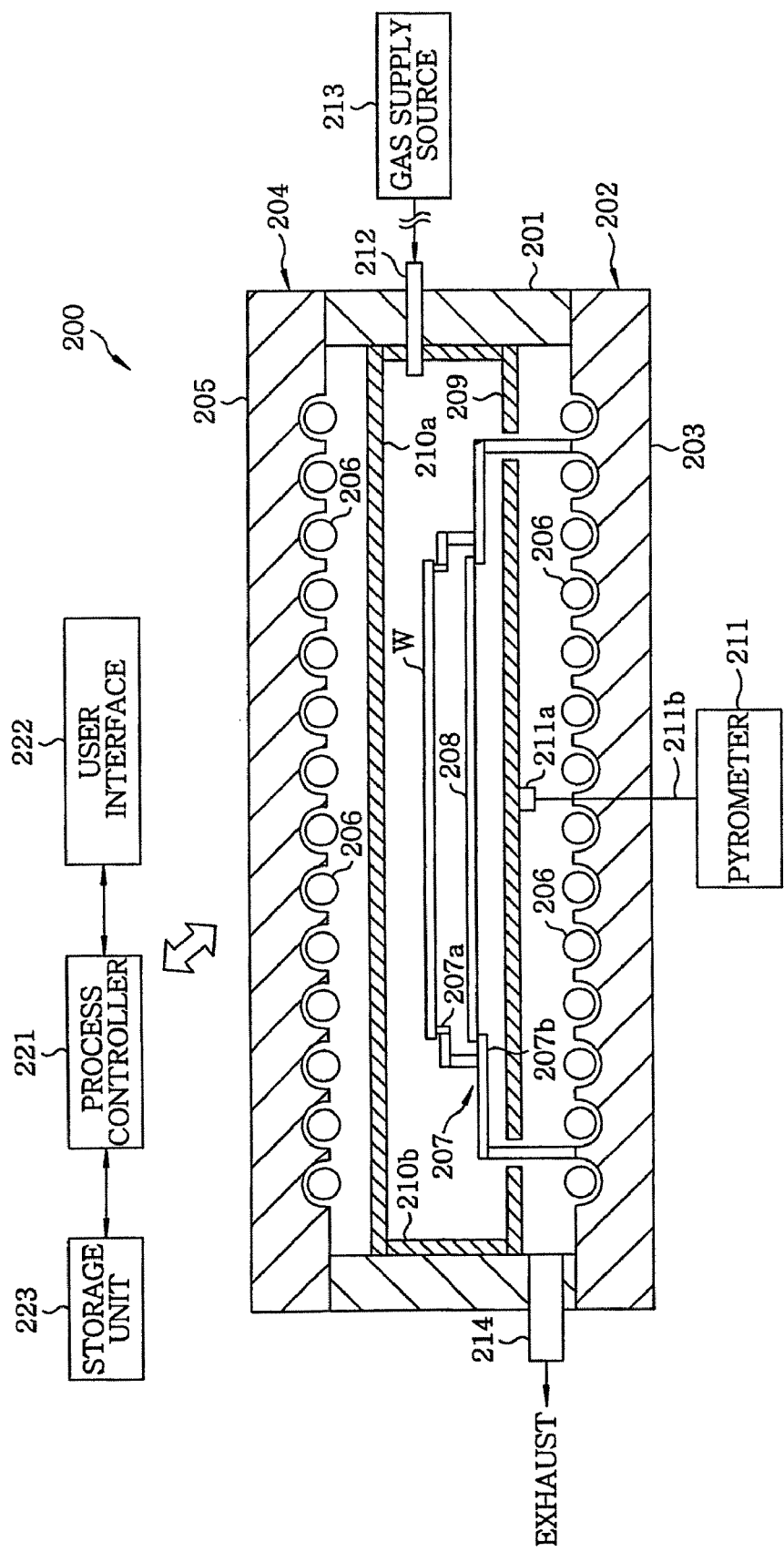
FIG. 15 is a section view showing a schematic configuration of a heat treatment apparatus.

FIG. 15 is a schematic configuration diagram showing a heat treatment apparatus capable of performing the substrate processing method in accordance with one embodiment of the present invention. The heat treatment apparatus 200 is formed of a RTP apparatus for performing rapid thermal annealing (RTA) which exhibits enhanced controllability. The heat treatment apparatus 200 may be used in, e.g., an annealing treatment which is performed in a high temperature region of about 800° C. to 1100° C. after impurities are doped into a thin film formed on a wafer W.

Referring to FIG. 15, "201" designates a cylindrical process chamber. On a lower side of the process chamber 201, there is provided a lower heating unit 202 in a detachable manner. On an upper side of the process chamber 201, there is detachably provided an upper heating unit 204 in a confronting relationship with the lower heating unit 202. The lower heating unit 202 includes a water cooling jacket 203 and a plurality of tungsten lamps 206 arranged on an upper surface of the water cooling jacket 203 to serve as a heating unit. Similarly, the upper heating unit 204 includes a water cooling jacket 205 and a plurality of tungsten lamps 206 arranged on a lower surface of the water cooling jacket 205 to serve as a heating unit. The present invention is not limited to the tungsten lamps 206 and other lamps, e.g., a halogen lamp, a Xenon lamp, a mercury lamp and a flash lamp, may be used in place of the tungsten lamps. The respective tungsten lamps 206 arranged in the process chamber 201 in a mutually confronting relationship are connected to a power supply not shown in the drawings. A heat generation quantity of the tungsten lamps 206 is controlled by a controller (process controller 221) that controls the intensity of electric power supplied from the power supply to the tungsten lamps 206.

A support part 207 for supporting a wafer W is provided between the lower heating unit 202 and the upper heating unit 204. The support part 207 includes wafer support pins 207a for supporting and holding the wafer W in the processing space of the process chamber 201 and a liner mounting portion 207b that supports a hot liner 208 for measuring a temperature of the wafer W in the process of treatment thereof. Furthermore, the support part 207 is connected to a rotating mechanism (not shown) that can rotate the support part 207 as a whole about a vertical axis. This ensures that the wafer W is rotated at a specified speed in the treatment process thereof, thereby assuring a uniform heat treatment.

A pyrometer 211 is arranged below the process chamber 201. The pyrometer 211 makes it possible to indirectly find the temperature of the wafer W by measuring heat rays of the hot liner 208 via a pot 211a and an optical fiber 211b in the process of heat treatment. Alternatively, the temperature of the wafer W may be measured in a direct manner.

Below the hot liner 208, a quartz member 209 is arranged between the hot liner 208 and the tungsten lamps 206 of the lower heating unit 202. As shown, the port 211a is attached to the quartz member 209. The port 211a may be provided in plural numbers.

Above the wafer W, a quartz member 210a is also arranged between the wafer W and the tungsten lamps 206 of the upper heating unit 204. On an inner circumferential surface, there is also provided a quartz member 210b in such a manner as to enclose the wafer W.

Lifter pins (not shown) for supporting and vertically moving the wafer W are provided to penetrate the hot liner 208. The lifter pins are used in loading and unloading the wafer W.

Sealing members (not shown) are interposed between the lower heating unit 202 and the process chamber 201 and between the upper heating unit 204 and the process chamber 201, whereby the process chamber 201 is kept air-tight.

On one side of the process chamber 201, there is provided a gas source supply 213 connected to a gas introduction pipe 212 so that it can introduce a gas such as $N_2$, $O_2$, Ar or the like into the treatment space of the process chamber 201. Furthermore, an evacuation pipe 214 is provided in a bottom portion of the process chamber 201 so that the process chamber 201 can be depressurized by means of an exhaust device not shown in the drawings.

Individual constituent parts of the heat treatment apparatus 200 are connected to and controlled by a process controller 221 having a CPU. As described above, connected to the process controller 221 are a keyboard for enabling a process manager to input commands for management of the heat treatment apparatus 200 and a user interface 222 including a display for visualizing and displaying an operating status of the heat treatment apparatus 200.

Also connected to the process controller 221 is a storage unit 223 that stores a control program (software) for allowing the process controller 221 to realize various treatments performed in the heat treatment apparatus 200 and a recipe in which a processing condition data and the like are recorded.

If necessary, a desired processing is performed in the heat treatment apparatus 200 under the control of the process controller 221 by retrieving an arbitrary recipe from the storage unit 223 according to a command inputted through the user interface 222 and allowing the process controller 221 to execute the recipe thus retrieved. For example, the heating speed and heating temperature of the wafer W can be controlled by allowing the process controller 221 to control the intensity of electric power supplied to the respective tungsten lamps 206 of the lower heating unit 202 and the upper heating unit 204. Furthermore, the control program and the recipe of a processing condition data or the like may be the ones stored in a computer-readable memory, e.g., a CD-ROM, a hard disk, a flexible disk or a flash memory or may be received from other devices from time to time, e.g., via a private communication line and used on an on-line basis.

In the heat treatment apparatus 200 configured as above, the wafer W is set on the support part 207 in the process chamber 201, after which an air-tight space is formed. Then, the tungsten lamps 206 of the lower heating unit 202 and the upper heating unit 204 is turned on by supplying specified electric power from a power supply not shown in the drawings to the tungsten lamps 206 under the control of the process controller 221. Thus, the respective tungsten lamps 206 begin to generate heat which in turn arrives at the wafer W through the quartz members 209 and 210a. The wafer W is rapidly heated at its upper and lower surfaces according to the conditions (a heat-up rate and a heating temperature) recorded in the recipe. While heating the wafer W, the process chamber 201 is brought into a vacuum state by operating an exhaust device not shown in the drawings and performing evacuation through the evacuation pipe 214.

During the course of heat treatment, the wafer W is rotated by allowing a rotating mechanism not shown in the drawings to rotate the entirety of the support part 207 about a vertical axis, i.e., in a horizontal direction, at a rotating speed of, e.g., 80 rpm. This assures uniformity of the heat quantity supplied to the wafer W.

Moreover, in the course of heat treatment, the temperature of the hot liner 208 is measured using the pyrometer 211. This makes it possible to indirectly measure the temperature of the wafer W. The temperature data measured by the pyrometer 211 is fed back to the process controller 221. If there is a difference between the measured temperature and a predetermined reference temperature, the electric power supplied to the tungsten lamps 206 is controlled to compensate the difference.

At the end of the heat treatment, the tungsten lamps 206 of the lower heating unit 202 and the upper heating unit 204 are turned off and a purge gas such as nitrogen or the like is introduced into the process chamber 201 through a purge port not shown in the drawings, during which time evacuation is performed through the evacuation pipe 214. The wafer W is then cooled and taken out.

Figure 16:
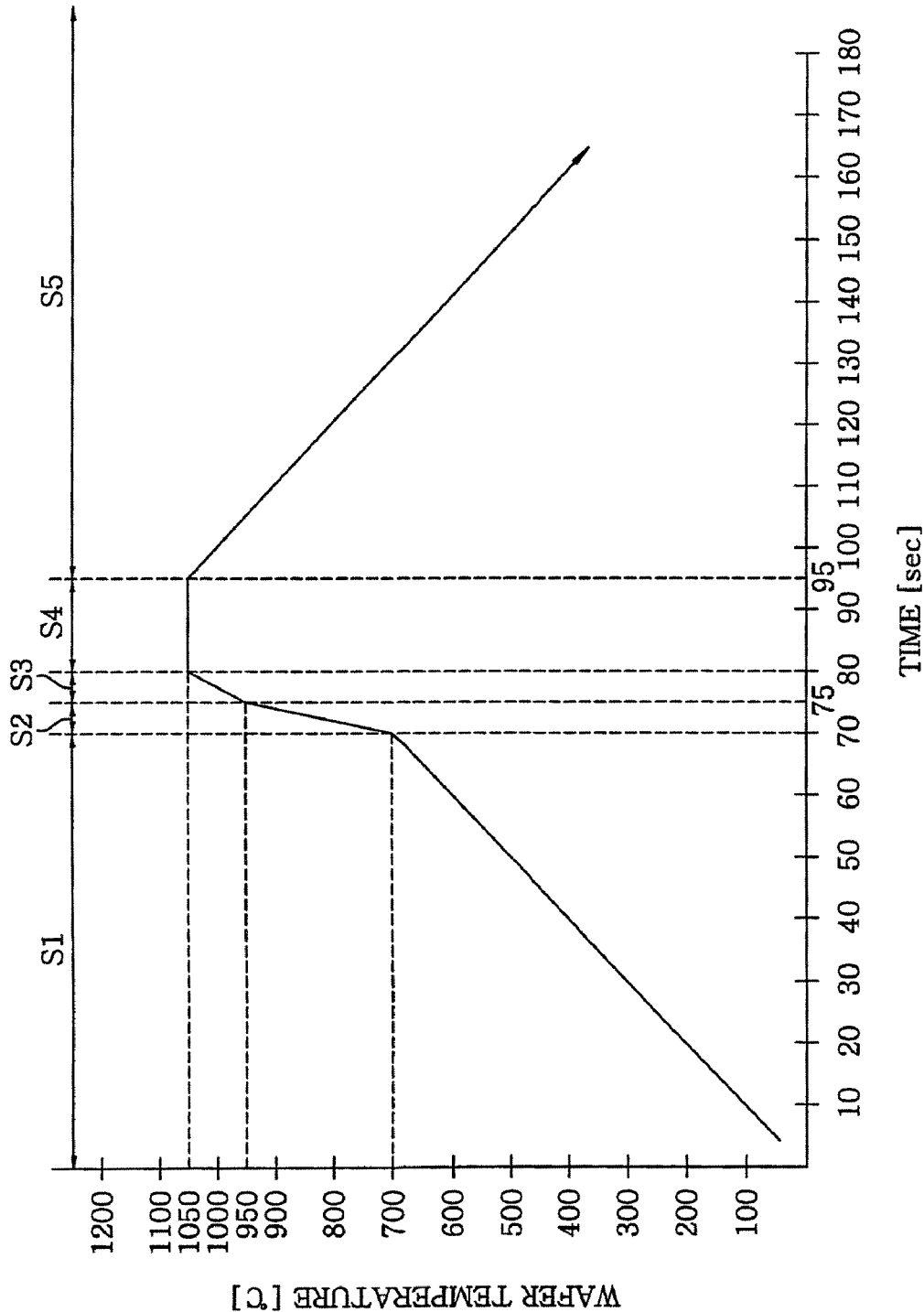
FIG. 16 is a view representing a time-dependent change of a wafer temperature.

The heat treatment apparatus 200 configured as above may employ, e.g., a temperature elevation progress illustrated in FIG. 16, as an example of the heat treatment process.

For example, in a first temperature elevation step S1, the wafer W is heated up under the control of the process controller 221 in such a manner that the temperature of the wafer W is elevated from a normal temperature to 700° C. within a time period of about 70 seconds and at a heat-up rate of about 10° C./sec. It is possible to prevent generation of a warp in the wafer W by heating the wafer W at this gentle heat-up rate up to 700° C. at which emissivity of the wafer W reaches a peak and becomes stable.

In a second temperature elevation step S2, the electric power supplied to the respective tungsten lamps 206 is increased under the control of the process controller 221 and the temperature of the wafer W is rapidly elevated at a heat-up rate of 50° C./sec for about 5 seconds from 700° C. to a second temperature X defined to satisfy the afore-mentioned equation: $3 \leq (T-X)/Y \leq 7$, where T denotes a heat treatment temperature and Y is a temperature elevation breadth per second in a third heat-up rate. In an instance that the heat treatment temperature is 1050° C., the second temperature becomes equal to 950° C. which is lower than the heat treatment temperature by 100° C. Due to the fact that, in the first temperature elevation step, the wafer W has been heated up to the temperature at which emissivity of the wafer W reaches a peak, generation of a warp in the wafer W can be avoided even if high speed heating is performed in the second temperature elevation step. This helps to improve a throughput and reduce a total thermal budget.

In a third temperature elevation step S3, the electric power supplied to the respective tungsten lamps 206 is reduced under the control of the process controller 221 and the temperature of the wafer W is elevated at a heat-up rate of 20° C./sec for about 5 seconds in a section of 100° C. ranging from 950° C. to 1050° C. which is the heat treatment temperature. By employing a heat-up rate smaller than that of the second temperature elevation step S2 in this way, it becomes possible to prevent occurrence of an overshoot, make an in-plane heating speed of the wafer uniform and avoid generation of a warp or a slip in the wafer W.

In a constant temperature annealing step S4, the electric power supplied to the respective tungsten lamps 206 is controlled under the control of the process controller 221 and annealing is performed for about 15 seconds at a constant temperature of 1050° C. (heat treatment temperature). Thereafter, the electric power supplied to the respective tungsten lamps 206 is cut off by the command of the process controller 221 and the temperature of the wafer W is lowered down at a predetermined cooling rate (a cooling step S5).

As described above, by performing the first to third temperature elevation steps S1 to S3, it becomes possible to process the wafer W at a high throughput while accurately controlling the temperature elevation of the wafer W.

Next, description will be made on the results of experiments conducted to confirm advantageous effects of the present invention.

As an Example of the present invention, a heat treatment including first to third temperature elevation steps was performed in the same conditions as illustrated in FIG. 16, using the heat treatment apparatus 200 shown in FIG. 15.

That is to say, a first temperature elevation step of heating up the wafer W to 700° C. was performed at a heat-up rate of 10° C./sec for about 70 seconds, a second temperature elevation step of heating up the wafer W from 700° C. to 950° C. was carried out at a heat-up rate of 50° C./sec for about 5 seconds, and a third temperature elevation step of heating up the wafer W from 950° C. to 1050° C. was conducted at a heat-up rate of 20° C./sec for about 5 seconds. Through these steps, the temperature of the wafer W was elevated to 1050° C., i.e., a heat treatment temperature.

On the other hand, as a Comparative Example, a heat treatment including two temperature elevation steps was conducted. That is to say, a first temperature elevation step of heating up the wafer W to 700° C. was performed at a heat-up rate of 10° C./sec for about 70 seconds, as is the case in the Example, and then the wafer W was straightforwardly heated up to the heat treatment temperature of 1050° C. at a heat-up rate of 50° C./sec for about 7 seconds.

Figure 17:
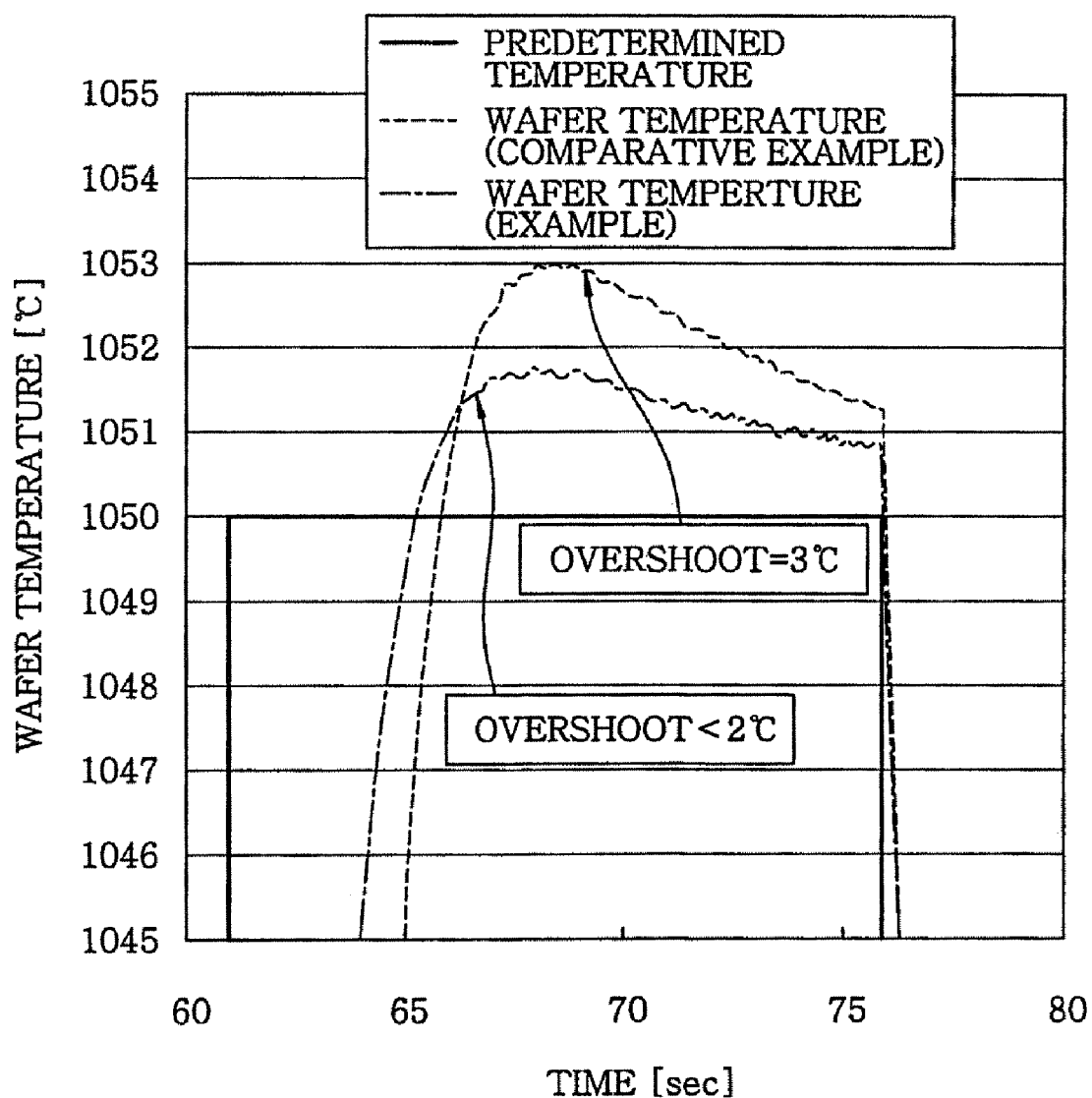
FIG. 17 is a view depicting a profile of a wafer temperature at around a heat treatment temperature.

Shown in FIG. 17 is the measurement results of an overshoot (excessive temperature elevation beyond the heat treatment temperature of 1050° C.) in the Example and the Comparative Example. Comparing the temperature elevation profiles of the Example and the Comparative Example shown in FIG. 17, it can be appreciated that the overshoot is reduced to below 2° C. in the Example, whereas the overshoot is increased to 3° C. in the Comparative Example. Furthermore, by employing the three temperature elevation steps, the in-plane temperature uniformity of the wafer W in the Example is superior to that in the Comparative Example, thereby making it possible to prevent generation of a warp in the wafer W during the process of temperature elevation. In contrast, in the Comparative Example employing the two temperature elevation steps, a warp of the wafer W is more severe than in the Example and there is a fear of reduced reliability attributable to crack of the wafer or breakage of parts in the process chamber.

Figure 18:
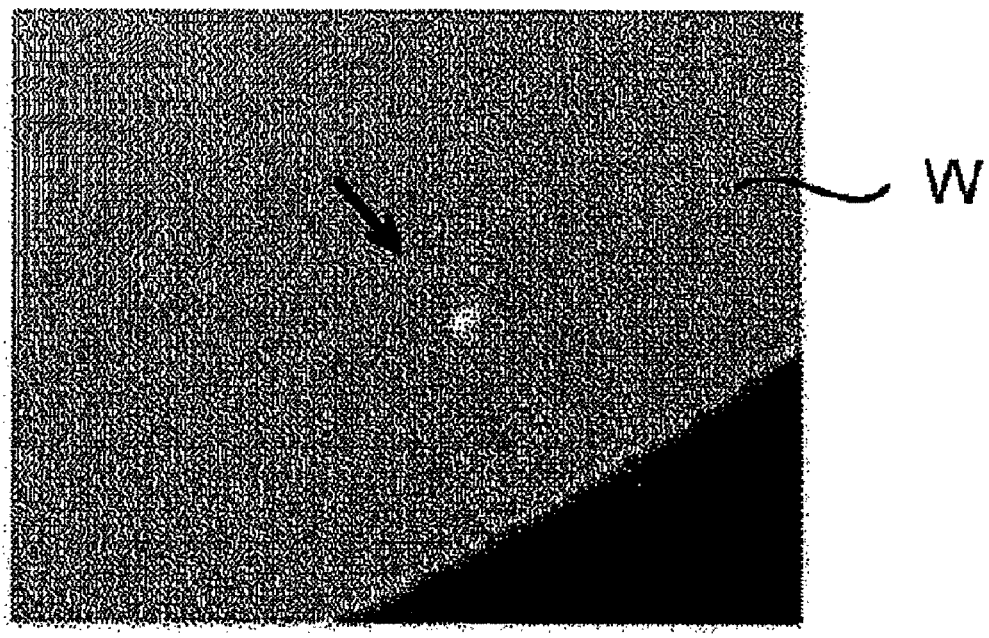
FIG. 18 is a view illustrating a slip after heat treatment in case of an experimental example.
Figure 19:
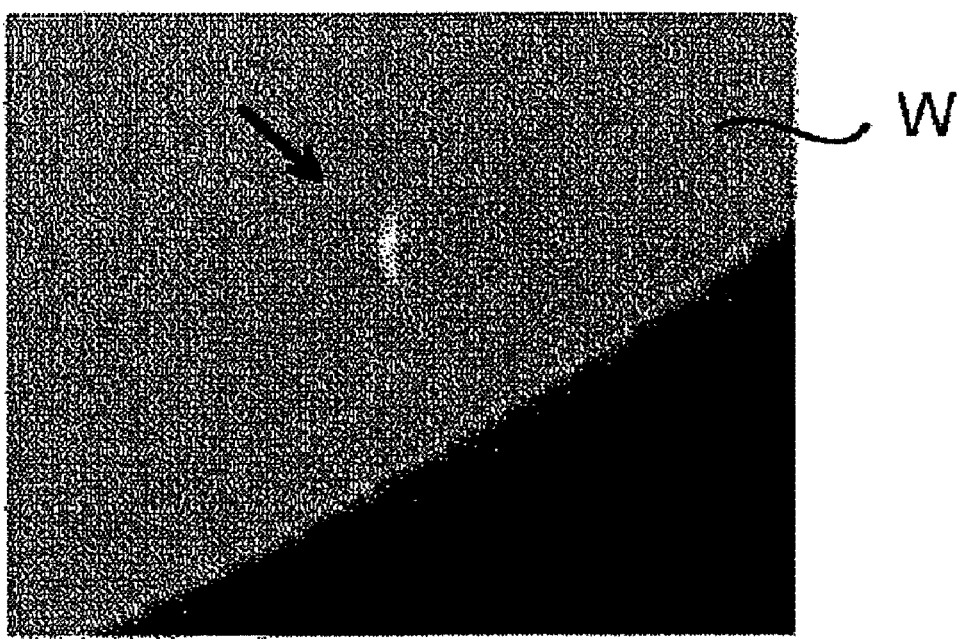
FIG. 19 is a view illustrating a slip after heat treatment in case of a comparative example.

FIG. 18 illustrates the state of a slip generated in the wafer W by the heat treatment of the Example and FIG. 19 shows the state of a slip generated in the wafer W by the heat treatment of the Comparative Example, both of which are the results of observing a portion of the wafer W corresponding to the position of a lifter pin by an X-ray topography. Each white spot indicated by an arrow in FIGS. 18 and 19 represent a place of generation of the slip. Comparing FIGS. 18 and 19, it can be seen that the slip is observed only in the lifter pin position in case of the Example (FIG. 18), which means a reduction of the slip, but the white spot indicating the slip extends linearly from the lifter pin position in case of the Comparative Example (FIG. 19). As noted above, by performing the temperature elevation process in three steps, the present invention is capable of reducing defects of the wafer W and improving the production efficiency and reliability of semiconductor products manufactured from the wafer W.

FIGS. 20 to 23 illustrate data of experiments for the influence on the plasma nitriding treatment exercised by presence or absence of the shower plate 44 having through-holes 43 of 10 mm in diameter (see FIG. 1) in the plasma processing apparatus 1. An oxide film ($SiO_2$ film) of 1 nm in thickness was used as a base film in the experiments.

Figure 20:
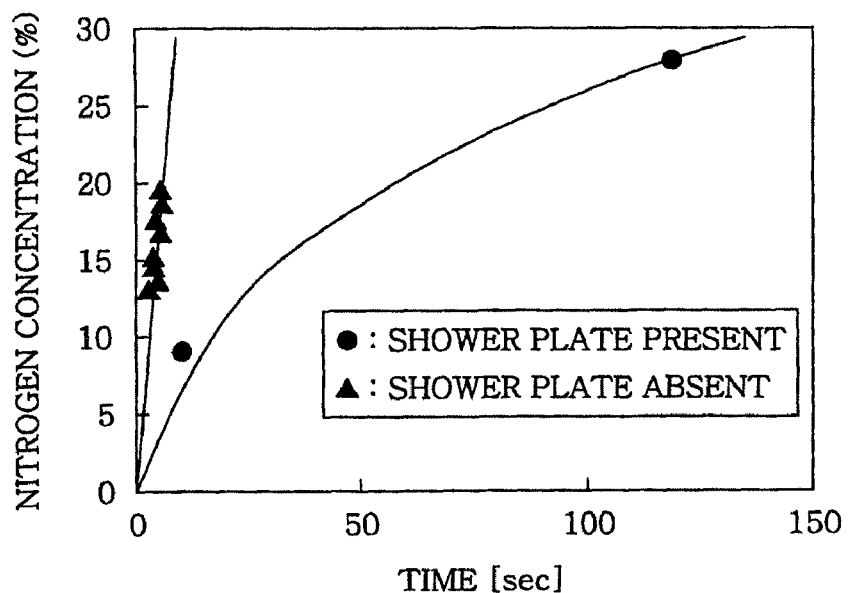
FIG. 20 is a graph representing the relationship between presence or absence of a shower plate and a nitriding rate.

FIG. 20 depicts a nitriding rate of the plasma nitriding treatment. It can be noted that the nitriding rate of the plasma nitriding treatment in case of presence of the shower plate 44 is smaller under the same nitriding treatment conditions than the nitriding rate in case of absence of the shower plate 44, thus exhibiting good controllability of a film thickness.

Figure 21:
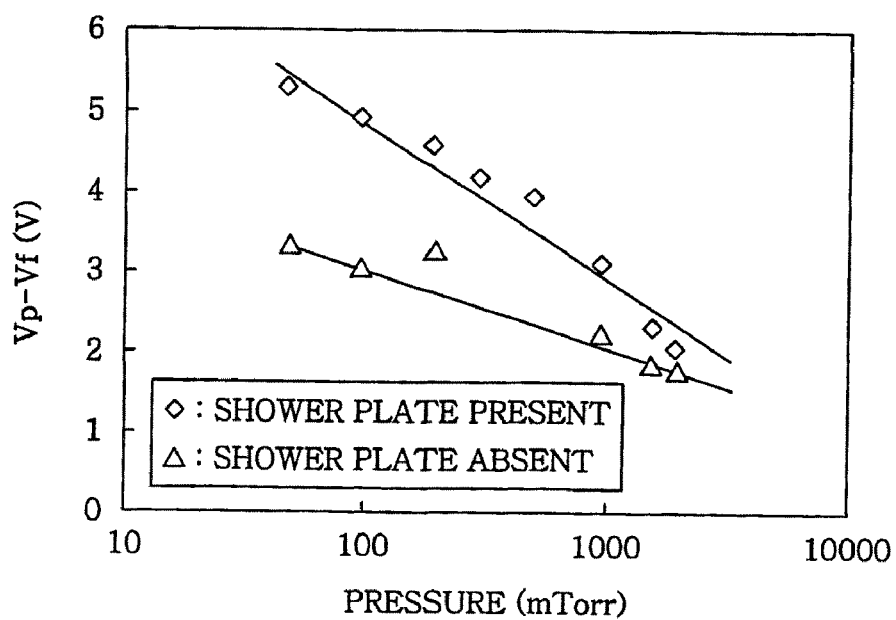
FIG. 21 is a graph representing the relationship between presence/absence of shower plate and ion energy of plasma.

FIG. 21 represents the intensity of ion energy in the event that a plasma nitriding treatment was conducted in the conditions of a microwave output power of 2 kW, an $Ar/N_2$ flow rate ratio of 1000/40 mL/min (sccm) and a treatment temperature of 400° C., while changing the treatment pressure and setting the treatment time to achieve a nitrogen concentration of 11%. In this case, the ion energy is represented by a potential difference ($V_p - V_f$) between a plasma potential ($V_p$) and a floating potential ($V_f$). It can be understood in FIG. 21 that it is easier in case of presence of the shower plate 44 than in case of absence of the shower plate 44 to control the potential difference ($V_p - V_f$) to about 3 to 3.5 eV which is desirable in nitriding $SiO_2$ into $Si_3N_4$ (the bonding energy of a S—N bond is 3.5 eV).

Figure 22:
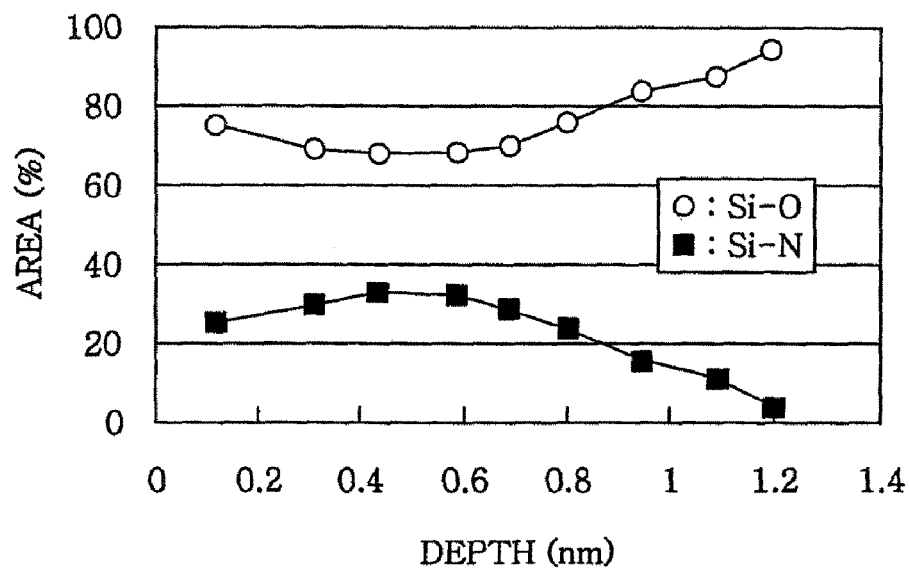
FIG. 22 is a graph representing XPS analysis results of a distribution of Si—O bonds and Si—N bonds in a silicon oxynitride film formed with no use of a shower plate.
Figure 23:
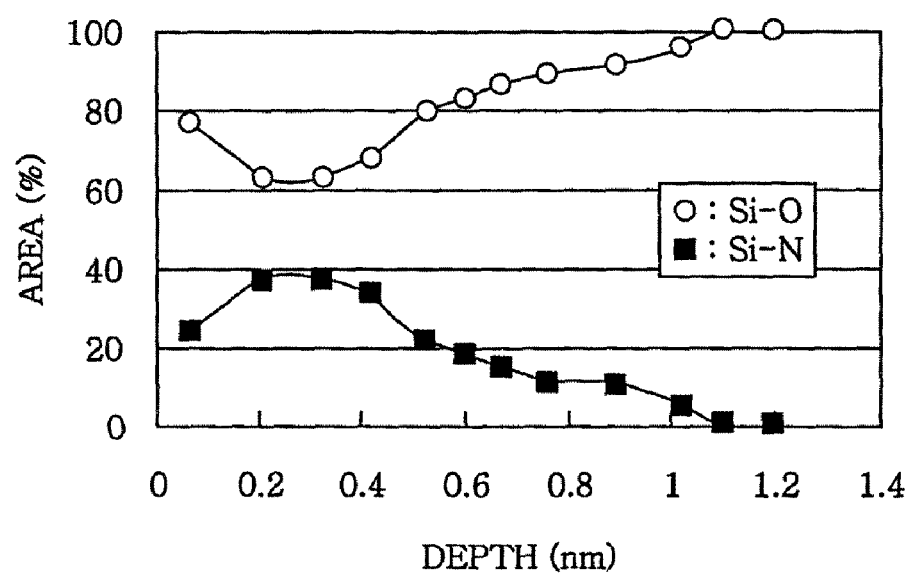
FIG. 23 is a graph representing XPS analysis results of a distribution of Si—O bonds and Si—N bonds in a silicon oxynitride film formed by use of a shower plate.

FIGS. 22 and 23 illustrate the XPS analysis results of a distribution of Si—O bonds and Si—N bonds in a silicon oxynitride film formed by the plasma nitriding treatment. In FIGS. 22 and 23, a horizontal axis represents the depth of a film and a vertical axis is the area in a film occupied by Si—O bonds and Si—N bonds (where Si—O bond+Si—N bonds=100%).

FIG. 22 is the results obtained in the event that a plasma nitriding treatment was conducted in the conditions of a microwave output power of 1.5 kW, an $Ar/N_2$ flow rate ratio of 1000/40 mL/min (sccm), a treatment pressure of 126.7 Pa (950 mTorr) and a treatment temperature of 400° C., with no use of the shower plate 44. FIG. 23 is the results obtained in the event that a plasma nitriding treatment was conducted in the conditions of a microwave output power of 1.5 kW, an $Ar/N_2$ flow rate ratio of 1000/40 mL/min (sccm), a treatment pressure of 6.7 Pa (50 mTorr) and a treatment temperature of 400° C., by using the shower plate 44.

Comparison of the results illustrated in FIGS. 22 and 23 reveals that use of the shower plate 44 allows a high Si—N peak to be formed on a surface of the silicon oxynitride film. This is because the plasma ion energy grows small by the use of the shower plate 44 and because nitrogen is not diffused deep into the film, thus resulting in an increased nitrogen concentration near the film surface. If the Si—N peak is formed near the surface of the insulating film in this way, a punch-through of boron can be avoided and nitrogen is prevented from entering the interface between silicon and the silicon oxynitride film. Thus, the Si/SiO interface is controlled to have a planar shape and an improvement is achieved in the ON-current characteristic ($I_{ON}$) and the mutual conductance Gm. This makes it possible to improve electrical characteristics of semiconductor devices such as a transistor and the like.

As set forth above, use of the shower plate 44 ensures that, even if the insulating film is thin, the plasma nitriding treatment can be performed with good controllability and a silicon oxynitride film of high quality can be formed. It is also possible to form an insulating film of even higher quality by performing the afore-mentioned annealing treatment after the plasma nitriding treatment has been conducted by use of the shower plate 44.

Although preferred embodiments of the present invention have been described by way of example, the present invention is not limited to these embodiments. In other words, the foregoing embodiments are intended to make clear the technical disclosure of the present invention and, in construing the scope of right, the present invention should not be confined to these specific embodiments. It is to be understood that various modifications or changes can be made without departing from the spirit and scope of the invention defined in the claims.

As an example, the plasma processing apparatus used in the nitriding treatment is not limited to the plasma processing apparatus 1 that makes use of the slot antenna 30 but may be a capacity-coupled plasma processing apparatus, an ICP processing apparatus, a surface-reflected wave plasma processing apparatus, an ECR plasma processing apparatus, a magnetron plasma processing apparatus and so forth.

Furthermore, although the heat treatment apparatus 200 for RTP shown in FIG. 15 has been described by way of example, the substrate processing method of the present invention may be applied to a treatment by which a film is formed on a substrate at a temperature of 800° C. or more and a treatment by which CVD film forming is performed by use of plasma at a temperature of 800° C. or more.

Moreover, the technical idea of the present invention may be applied to, e.g., a case that the object substrate is a glass substrate for a flat panel display (FPD) represented by a liquid crystal display (LCD) or a case that the object substrate is a compound semiconductor substrate.

INDUSTRIAL APPLICABILITY

The present invention can be suitably used in manufacturing, e.g., various kinds of semiconductor devices such as a transistor and the like or a flat panel display.

What is claimed is:

1. An insulating film forming method, comprising:
    nitriding an oxide film on an object substrate through a plasma nitriding treatment; and
    annealing the nitrided object substrate,
    wherein said annealing includes sequential steps of:
        heating up the nitrided object substrate at a first heat-up rate to a first fixed temperature between 600° C. and 700° C.;
        performing a first annealing treatment on the nitrided object substrate while maintaining the nitrided object substrate at the first fixed temperature for an annealing time of about 1 to 40 seconds;
        heating up the nitrided object substrate at a second heat-up rate from the first fixed temperature to a second temperature of 950° C. to 1150° C.; and
        performing a second annealing treatment on the nitrided object substrate while maintaining the nitrided object substrate at the second temperature for an annealing time of about 5 to 60 seconds, and
    wherein the sequential steps of said annealing are performed while maintaining the nitrided object substrate at a pressure of 66.7 Pa to 933.2 Pa in an oxidizing atmosphere.

2. The insulating film forming method of claim 1, wherein the annealing time of the second annealing treatment is about 10 to 40 seconds.

3. The insulating film forming method of claim 1, wherein the oxide film is formed by thermal oxidation or plasma oxidation.

4. The insulating film forming method of claim 1, wherein an apparatus used for processing the object substrate is a RTP apparatus.

5. The insulating film forming method of claim 1, wherein the second heat-up rate is different from the first heat-up rate.

6. The insulating film forming method of claim 1, wherein the second heat-up rate is greater than the first heat-up rate.

7. An insulating film forming method, comprising:
    nitriding an oxide film on an object substrate through a plasma nitriding treatment; and
    annealing the nitrided object substrate at a pressure of 66.7 Pa to 933.2 Pa,
    wherein the annealing step includes the sequential steps of:
        performing a first annealing treatment on the nitrided object substrate while maintaining the nitrided object substrate at a first fixed temperature between 600° C. and 700° C.;
        heating up the nitrided object substrate from the first fixed temperature to a second temperature of 950° C. to 1150° C.; and
        performing a second annealing treatment on the nitrided object substrate at the second temperature,
    wherein the annealing step further includes the steps of:
        prior to the step of performing the first annealing treatment, heating up the nitrided object substrate at a first heat-up rate to the first fixed temperature of the first annealing treatment;
        after the step of performing the first annealing treatment, heating up the nitrided object substrate at a second heat-up rate from the first fixed temperature to an intermediate temperature $K_M$ lower than the second temperature; and
        heating up the nitrided object substrate at a third heat-up rate to the second temperature,
    wherein the intermediate temperature $K_M$ is defined to satisfy the following equation:

$$3 \leq (K_2 - K_m)Y \leq 7,$$

where $K_2$ is the second temperature of the second annealing treatment and Y denotes a temperature elevation breadth per second in the third heat-up rate, and
    wherein the third heat-up rate is smaller than the second heat-up rate.

8. The insulating film forming method of claim 7, wherein the third heat-up rate is equal to or greater than the first heat-up rate.

9. The insulating film forming method of claim 7, wherein the second heat-up rate is 40° C./sec to 60° C./sec.

10. The insulating film forming method of claim 7, wherein the third heat-up rate is 15° C./sec to 30° C./sec.

11. The insulating film forming method of claim 7, wherein the first heat-up rate is cc 5° C./sec to 15° C./sec.

12. An insulating film forming method, comprising:
    nitriding an oxide film on an object substrate through a plasma nitriding treatment; and
    annealing the nitrided object substrate at a pressure of 66.7 Pa to 933.2 Pa,
    wherein the annealing step includes the sequential steps of:
        performing a first annealing treatment on the nitrided object substrate while maintaining the nitrided object substrate at a first fixed temperature between 600° C. and 700° C.;
        heating up the nitrided object substrate from the first fixed temperature to a second temperature of 950° C. to 1150° C.; and
        performing a second annealing treatment on the nitrided object substrate at the second temperature, and wherein the oxide film is subjected to the plasma nitriding treatment by a microwave plasma generated by using a planar antenna having a multiple number of slot holes.

13. An insulating film forming method, comprising:
nitriding an oxide film on an object substrate through a plasma nitriding treatment; and
annealing the nitrided object substrate at a pressure of 66.7 Pa to 933.2 Pa,
wherein the annealing step includes the sequential steps of:
performing a first annealing treatment on the nitrided object substrate while maintaining the nitrided object substrate at a first fixed temperature between 600° C. and 700° C.;
heating up the nitrided object substrate from the first fixed temperature to a second temperature of 950° C. to 1150° C.; and
performing a second annealing treatment on the nitrided object substrate at the second temperature and
wherein the object substrate subjected to the plasma nitriding treatment is loaded into and annealed by an annealing apparatus that performs an annealing treatment, the nitrided object substrate being loaded into the annealing apparatus in a depressurized atmosphere without being exposed to the ambient air.

14. A computer-readable storage medium including computer executable instructions, where the instructions, when executed by a processor, cause the processor to perform an insulating film forming method comprising:
nitriding an oxide film on an object substrate through a plasma nitriding treatment; and
annealing the nitrided object substrate,
wherein said annealing includes sequential steps of:
heating up the nitrided object substrate at a first heat-up rate to a first fixed temperature between 600° C. and 700° C.;
performing a first annealing treatment on the nitrided object substrate while maintaining the nitrided object substrate at the first fixed temperature for an annealing time of about 1 to 40 seconds;
heating up the nitrided object substrate at a second heat-up rate from the first fixed temperature to a second temperature of 950° C. to 1150° C.; and
performing a second annealing treatment on the nitrided object substrate while maintaining the nitrided object substrate at the second temperature for an annealing time of about 5 to 60 seconds, and
wherein the sequential steps of said annealing are performed while maintaining the nitrided object substrate at a pressure of 66.7 Pa to 933.2 Pa in an oxidizing atmosphere.

15. A substrate processing method, comprising:
nitriding an oxide film on an object substrate through a plasma nitriding treatment;
annealing the nitrided object substrate,
wherein the annealing step further includes sequential steps of:
heating up, in a processing chamber of a substrate processing apparatus, the nitrided object substrate at a first heat-up rate to a first fixed temperature at which emissivity of the nitrided object substrate is greatest;
performing a first annealing treatment on the nitrided object substrate while maintaining the nitrided object substrate at the first fixed temperature;
heating up the nitrided object substrate at a second heat-up rate from the first fixed temperature to a second temperature X which is lower than a heat treatment temperature; and
heating up the nitrided object substrate at a third heat-up rate from the second temperature X to the heat treatment temperature,
wherein the heat treatment temperature is equal to or greater than 800° C. and the second temperature X is defined to satisfy the following equation:

$$3 \leq (T-X)/Y \leq 7,$$

where T denotes the heat treatment temperature and Y is a temperature elevation breadth per second in the third heat-up rate,
wherein the third heat-up rate is smaller than the second heat-up rate, and
wherein the object substrate is processed at a processing pressure of 106.66 Pa to 101325 Pa.

16. The substrate processing method of claim 15, wherein the third heat-up rate is equal to or greater than the first heat-up rate.

17. The substrate processing method of claim 15, wherein the second heat-up rate is 40° C./sec to 60° C./sec.

18. The substrate processing method of claim 15, wherein the third heat-up rate is 15° C./sec to 30° C./sec.

19. The substrate processing method of claim 15, wherein the first heat-up rate is 5° C./sec to 15° C./sec.

20. The substrate processing method of claim 15, wherein the second temperature X and the heat treatment temperature are both in a range of 800° C. to 1100° C.

21. The substrate processing method of claim 15, wherein the object substrate is a silicon substrate and the first fixed temperature is 600° C. to 700° C.

22. A computer-readable storage medium including computer executable instructions, where the instructions, when executed by a processor, cause a substrate processing apparatus to perform a substrate processing method, the method comprising:
nitriding an oxide film on an object substrate through a plasma nitriding treatment;
annealing the nitrided object substrate,
wherein the annealing step includes the sequential steps of:
heating up, in a processing chamber of the substrate processing apparatus, the nitrided object substrate at a first heat-up rate to a first fixed temperature at which emissivity of the nitrided object substrate becomes greatest;
performing a first annealing treatment on the nitrided object substrate while maintaining the nitrided object substrate at the first fixed temperature;
heating up the nitrided object substrate at a second heat-up rate from the first fixed temperature to a second temperature X lower than a heat treatment temperature; and
heating up the nitrided object substrate at a third heat-up rate from the second temperature X to the heat treatment temperature,
wherein the heat treatment temperature is equal to or greater than 800° C. and the second temperature X is defined to satisfy the following equation:

$$3 \leq (T-X)/Y \leq 7,$$

where T denotes the heat treatment temperature and Y is a temperature elevation breadth per second in the third heat-up rate,
wherein the third heat-up rate is smaller than the second heat-up rate, and
wherein the object substrate is processed at a processing pressure of 106.66 Pa to 101325 Pa.

* * * * *